(12) United States Patent
Hisanaga et al.

(10) Patent No.: US 11,239,144 B2
(45) Date of Patent: Feb. 1, 2022

(54) SEMICONDUCTOR DEVICE AND METHOD OF PRODUCING SEMICONDUCTOR DEVICE

(71) Applicant: PANASONIC INTELLECTUAL PROPERTY MANAGEMENT CO., LTD., Osaka (JP)

(72) Inventors: Hidesato Hisanaga, Toyama (JP); Akira Sengoku, Aichi (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 125 days.

(21) Appl. No.: 16/706,242

(22) Filed: Dec. 6, 2019

(65) Prior Publication Data

US 2020/0185316 A1 Jun. 11, 2020

(30) Foreign Application Priority Data

Dec. 10, 2018 (JP) .............................. JP2018-230523

(51) Int. Cl.
| | |
|---|---|
| *H01L 23/498* | (2006.01) |
| *H01L 23/31* | (2006.01) |
| *H01L 21/48* | (2006.01) |
| *H01L 21/56* | (2006.01) |
| *H01L 23/00* | (2006.01) |

(52) U.S. Cl.
CPC .... *H01L 23/49838* (2013.01); *H01L 21/4853* (2013.01); *H01L 21/563* (2013.01); *H01L 23/3121* (2013.01); *H01L 24/16* (2013.01); *H01L 2224/16227* (2013.01)

(58) Field of Classification Search
None
See application file for complete search history.

(56) References Cited

U.S. PATENT DOCUMENTS

| | | | |
|---|---|---|---|
| 2001/0013641 | A1 | 8/2001 | Onodera et al. |
| 2002/0135061 | A1* | 9/2002 | Okamoto ............ H01L 23/3735 257/703 |

(Continued)

FOREIGN PATENT DOCUMENTS

| | | |
|---|---|---|
| JP | 2001-230274 A | 8/2001 |
| JP | 2012-231167 A | 11/2012 |

(Continued)

*Primary Examiner* — Long Pham
(74) *Attorney, Agent, or Firm* — McDermott Will and Emery LLP

(57) ABSTRACT

A semiconductor device includes a mounting substrate; a first wiring electrode and a second wiring electrode disposed on a main surface of a mounting substrate; an interposing member disposed between the first wiring electrode and the second wiring electrode; a semiconductor element flip-chip connected with the first wiring electrode and the second wiring electrode via a first electrical connection member and a second electrical connection member so as to at least partially overlap the interposing member in a top surface view; and a resin disposed in contact with the semiconductor element and the mounting substrate. The wettability of the interposing member to the resin is higher than that of the mounting substrate to the resin. The resin is disposed in contact with the semiconductor element and the interposing member.

7 Claims, 16 Drawing Sheets

(56) References Cited

U.S. PATENT DOCUMENTS

| | | | |
|---|---|---|---|
| 2002/0145195 A1* | 10/2002 | Okamoto | C22C 32/0021 257/720 |
| 2004/0031545 A1* | 2/2004 | Okamoto | H01L 23/3735 148/553 |
| 2009/0095514 A1 | 4/2009 | Kaneko | |
| 2018/0138377 A1 | 5/2018 | Senuki et al. | |

FOREIGN PATENT DOCUMENTS

| | | |
|---|---|---|
| WO | 2008/111345 A1 | 9/2008 |
| WO | 2017/013870 A1 | 1/2017 |
| WO | 2019/064980 A1 | 4/2019 |

* cited by examiner

SEMICONDUCTOR DEVICE AND METHOD OF PRODUCING SEMICONDUCTOR DEVICE

CROSS REFERENCE TO RELATED APPLICATION

The present application is based on and claims priority of Japanese Patent Application No. 2018-230523 filed on Dec. 10, 2018. The entire disclosure of the above-identified application, including the specification, drawings and claims is incorporated herein by reference in its entirety.

FIELD

The present disclosure relates to semiconductor devices and a method of producing a semiconductor device.

BACKGROUND

Conventional semiconductor devices each include a mounting substrate and a semiconductor element flip-chip connected with the mounting substrate. In the case where the semiconductor element is flip-chip connected with the mounting substrate, gaps between the semiconductor element and the mounting substrate are formed with bumps or solder, for example. The gaps formed between the semiconductor element and the mounting substrate are filled with a resin in some cases (see PTL 1, for example). In this case, if the gaps are not fully filled with the resin and the residual air generates unfilled portions between the semiconductor element and the mounting substrate, the semiconductor device may break down due to expansion of the air caused by heat generated when the semiconductor element is electrically conducted, for example.

PTL 1 discloses a technique of facilitating filling of a resin into a space between a semiconductor element and a mounting substrate by forming grooves on a surface of at least one of the semiconductor element and the mounting substrate to increase the interval between the semiconductor element and the mounting substrate, the surface facing the other of the semiconductor element and the mounting substrate.

CITATION LIST

Patent Literature

PTL 1: WO2008/111345

SUMMARY

Technical Problem

However, in the conventional technique, grooves are formed in at least one of the semiconductor element and the mounting substrate by cutting away the surface of at least one of the semiconductor element and the mounting substrate, for example. For this reason, debris are generated by the formation of grooves. Those debris may cause breakdown of the semiconductor device.

An object of the present disclosure is to provide a semiconductor device which can prevent breakdown by eliminating cutting away of the semiconductor element or the mounting substrate and preventing generation of unfilled portions.

Solution to Problem

The semiconductor device according to one aspect of the present disclosure includes a mounting substrate; a first wiring electrode, a second wiring electrode, and an interposing member disposed between the first wiring electrode and the second wiring electrode, the first wiring electrode, the second wiring electrode, and the interposing member being disposed on a main surface of the mounting substrate; a semiconductor element which is flip-chip connected with the first wiring electrode and the second wiring electrode via a first electrical connection member and a second electrical connection member, and at least partially overlaps the interposing member in a top surface view; and a resin disposed in contact with the semiconductor element and the mounting substrate, wherein wettability of the interposing member to the resin is higher than wettability of the mounting substrate to the resin, and the resin is disposed in contact with the semiconductor element and the interposing member.

The method of producing the semiconductor device according to one aspect of the present disclosure includes forming a first wiring electrode, a second wiring electrode, and an interposing member on a main surface of a mounting substrate, the interposing member being disposed between the first wiring electrode and the second wiring electrode; flip-chip connecting a semiconductor element with the first wiring electrode and the second wiring electrode via a first electrical connection member and a second electrical connection member so as to at least partially overlap the interposing member in a top surface view; and filling a resin into a space between the mounting substrate and the semiconductor element flip-chip connected with the mounting substrate, the space extending along the interposing member.

Advantageous Effects

The semiconductor device according to one aspect of the present disclosure can reduce breakdown by eliminating cutting away of the semiconductor element or the mounting substrate to prevent generation of unfilled portions.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
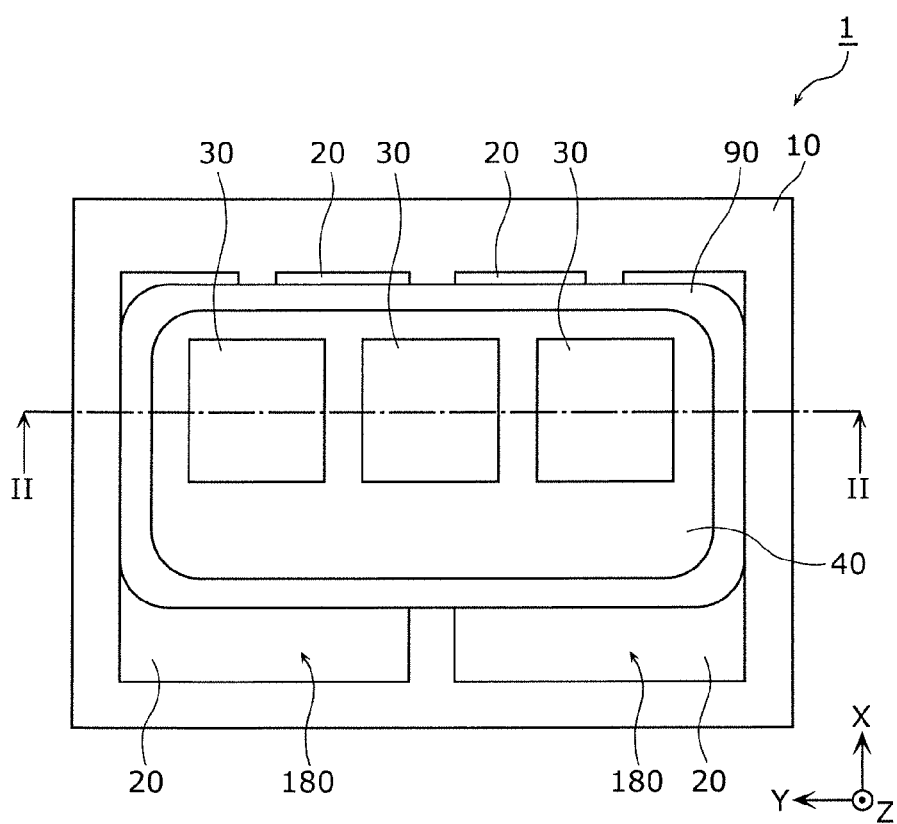
FIG. 1 is a top view illustrating a semiconductor device according to Embodiment 1.

Embodiments according to the present disclosure will now be described in detail with reference to the drawings. It is noted that the embodiments described below all illustrate specific examples of the present disclosure. Numeric values, shapes, materials, components, arrangements, positions, and connection forms of the components, steps, order of the steps, and the like illustrated in the following embodiments are exemplary, and should not be construed as limitative to the present disclosure.

The drawings are schematic views, and are not always strictly drawn. Accordingly, the drawings are not always drawn to scale, for example. In the drawings, identical referential numerals are given to substantially identical configurations, and duplication of descriptions of the substantially identical configurations will be omitted or simplified in some cases.

In the following embodiments, expressions using a term "approximately" which means approximately identical are used. For example, the term "approximately identical" means not only completely identical, but also substantially identical, in other words, means that a numeric value includes a difference of about several percent, for example. The same applies to other expressions using the term "approximately."

In the following embodiments, the terms "upper" and "lower" should not be construed to indicate an upper direction (above) and a lower direction (below) in absolute space recognition. The terms "upper" and "lower" are used not only in the case where two components are spaced from each other and another component exists between the two components, but also in the case where two components are disposed in close contact with each other.

In the embodiments described below, the term "top surface view" or "planar view" refers to the case where a main surface of a mounting substrate on which a semiconductor element is mounted is seen from the normal direction of the main surface.

Embodiment 1

[Configuration]

The configuration of the semiconductor device according to Embodiment 1 will first be described with reference to FIGS. 1 to 4.

Figure 2:
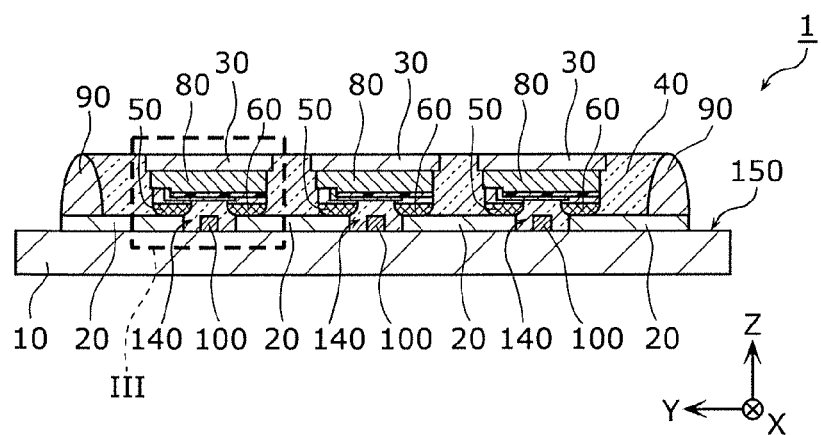
FIG. 2 is a sectional view of the semiconductor device according to Embodiment 1 taken along line II-II of FIG. 1.
Figure 3:
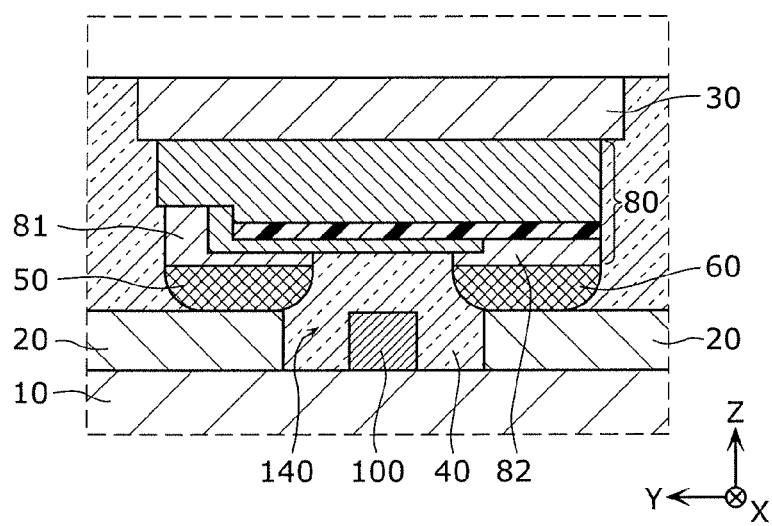
FIG. 3 is a partially enlarged sectional view illustrating the semiconductor device according to Embodiment 1, where a region surrounded by dashed line III of FIG. 2 is enlarged for illustration.
Figure 4:
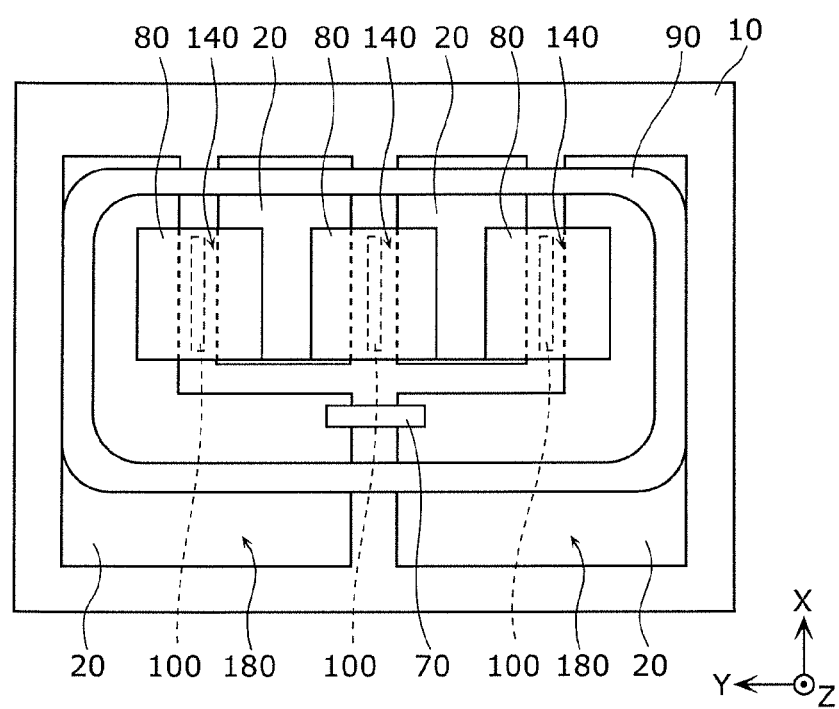
FIG. 4 is a top view for illustrating an interposing member included in the semiconductor device according to Embodiment 1.

FIG. 1 is a top view illustrating semiconductor device 1 according to Embodiment 1. FIG. 2 is a sectional view illustrating semiconductor device 1 according to Embodiment 1 taken along line II-II of FIG. 1. FIG. 3 is a partially enlarged sectional view of semiconductor device 1 according to Embodiment 1, where a region surrounded by dashed line III of FIG. 2 is illustrated. FIG. 4 is a top view illustrating interposing member 100 included in semiconductor device 1 according to Embodiment 1. In FIG. 4, the illustration of wavelength converting member 30 and resin 40 included in semiconductor device 1 are omitted. In FIG. 4, interposing member 100 is schematically illustrated, where the position in which interposing member 100 is disposed is surrounded by a dashed line in.

As illustrated in FIGS. 1 to 4, semiconductor device 1 includes mounting substrate 10, wiring electrode 20, wavelength converting member 30, resin 40, first electrical connection member 50, second electrical connection member 60, protective element 70, semiconductor element 80, dam material 90, and interposing member 100.

Semiconductor device 1 includes semiconductor element 80 flip-chip connected with (flip-chip mounted on) the surface of mounting substrate 10. Semiconductor element 80 is a light-emitting element, such as a light emitting diode (LED). In the present embodiment, semiconductor device 1 is a light-emitting device including semiconductor element 80 as a light-emitting element.

Mounting substrate 10 is a substrate, such as a submount, with which semiconductor element 80 is flip-chip connected. Mounting substrate 10 includes at least two wiring electrodes 20 electrically connected with semiconductor element 80.

Mounting substrate 10 may be formed from any material. The material may be metal, ceramic, or resin, for example. Examples of the material for ceramic substrates include aluminum nitride (AlN), aluminum oxide ($Al_2O_3$), beryllium oxide (BeO), silicon carbide (SiC), silicon dioxide ($SiO_2$), and silicon nitride ($Si_3N_4$).

Main surface 150 of mounting substrate 10 may be formed from one selected from the group consisting of AlN, $Al_2O_3$, BeO, SiC, $SiO_2$, and $Si_3N_4$. For example, in the case where mounting substrate 10 is a multi-layer substrate, the material for the layer corresponding to main surface 150 of mounting substrate 10 may be one selected from the group consisting of AlN, $Al_2O_3$, BeO, SiC, $SiO_2$, and $Si_3N_4$. Alternatively, mounting substrate 10 may be a ceramic, resin, or metal substrate having a main surface formed from one selected from the group consisting of AlN, $Al_2O_3$, BeO, SiC, $SiO_2$, and $Si_3N_4$, for example.

Examples of the material for the metal substrate include copper, aluminum, iron, and alloys thereof. Examples of the material for the resin substrate include glass epoxy resin.

Wiring electrode 20 is an electrode disposed on main surface 150 of mounting substrate 10 and electrically connected with semiconductor element 80. Wiring electrode 20 is a patterned wiring formed on mounting substrate 10, for example. Wiring electrode 20 may be, for example, a via electrode which penetrates through mounting substrate 10 from main surface 150 of mounting substrate 10 to the rear surface of mounting substrate 10 opposite to main surface 150. In other words, wiring electrode 20 may be an electrode which is not drawn as a wiring on main surface 150.

Mounting substrate 10 includes at least two wiring electrodes 20 which are not in contact with each other. In the present embodiment, four wiring electrodes 20 are disposed on main surface 150 of mounting substrate 10. For example, connector 180 for two wiring electrodes 20 not covered with resin 40 and dam material 90 is connected with a battery or an external commercial power supply not illustrated to feed electricity to semiconductor element 80.

Wiring electrode 20 illustrated in the present embodiment can have any shape in a top surface view and can be arranged in any manner without limitation. The shape in a top surface view and the arrangement of wiring electrode 20 disposed on mounting substrate 10 may be varied according to the arrangements and the shapes of first electrical connection member 50 and second electrical connection member 60 included in semiconductor element 80.

In the following description, among several wiring electrodes 20 disposed on mounting substrate 10, one of two wiring electrodes electrically connected with a common semiconductor element 80 is referred to as a first wiring electrode and the other is referred to as a second wiring electrode in some cases. For example, the first wiring electrode is connected with first electrical connection member 50 included in semiconductor element 80, and the second wiring electrode is connected with second electrical connection member 60 included in semiconductor element 80.

Any metallic material having conductivity can be used as the material for wiring electrode 20 without limitation. Examples of the material for wiring electrode 20 include gold (Au), aluminum (Al), copper (Cu), and laminates containing these metals.

In the case where semiconductor element 80 is a light-emitting element which emits light, wavelength converting member 30 is a plate-like member containing a fluorescent substance and converting the wavelength of at least part of the light emitted from semiconductor element 80 as a light-emitting element. In the present embodiment, semiconductor device 1 includes three wavelength converting members 30 corresponding to three semiconductor elements 80. Wavelength converting member 30 is bonded to the top surface (the surface in the positive direction of the Z-axis) of semiconductor element 80. The size, the number, and the shape of wavelength converting member 30 included in semiconductor device 1 are not limited in particular. For example, semiconductor device 1 may include one wavelength converting member 30 which covers all of several semiconductor elements 80.

Wavelength converting member 30 can contain any fluorescent substance. Examples of the fluorescent substance contained in wavelength converting member 30 include YAG ($Y_3Al_5O_{12}$) yellow fluorescent substances, CASN ($CaAlSiN_3$) red fluorescent substances, and SiAlON green fluorescent substances. Wavelength converting member 30 is formed from a resin, ceramic, or glass material in which these fluorescent substances are dispersed.

Resin 40 is disposed in contact with semiconductor element 80 and interposing member 100. More specifically, resin 40 is located in a space between the bottom surface (more specifically, the surface in the negative direction of the Z-axis) of semiconductor element 80 and the top surface (more specifically, the surface in the positive direction of the Z-axis) of interposing member 100. Resin 40 has a function to facilitate dissipation of heat generated in semiconductor element 80 to mounting substrate 10, for example. Resin 40 is located in gap 140, which is a space defined by semiconductor element 80 and mounting substrate 10. For this reason, resin 40 is filled in contact with semiconductor element 80 and interposing member 100 so as to embed into gap 140. Resin 40 is located around semiconductor element 80 excluding the top surface thereof. More specifically, resin 40 surrounds semiconductor element 80 in a top surface view. In the present embodiment, such an arrangement of resin 40 allows resin 40 to function as an encapsulating member for encapsulating semiconductor element 80.

Although resin 40 is arranged so as to fill the space surrounded by dam material 90 in a top surface view in the present embodiment, resin 40 may be filled in gap 140 between semiconductor element 80 and mounting substrate 10. In other words, resin 40 may be an underfilling resin located in a lower portion of semiconductor element 80.

Resin 40 contains at least one selected from the group consisting of silicone resins and epoxy resins, for example. More specifically, examples of the material for resin 40 include silicone resins, epoxy resins, composites containing silicone resins, composites containing epoxy resins, and composites containing silicone resins and epoxy resins.

Resin 40 may contain a particulate light-reflective material. For example, resin 40 includes a matrix, such as a silicone resin or an epoxy resin, and a particulate light-reflective material dispersed in the matrix. Examples of the light-reflective material include titanium oxide ($TiO_2$) and zinc oxide (ZnO). Resin 40 containing the light-reflective material is disposed through curing of a liquid silicone resin containing particulate $TiO_2$ and a dispersant, for example. As a result, resin 40 has electrical insulation and light reflectivity. In semiconductor element 80, which is a light-emitting element because resin 40 has light reflectivity, light emitted from the lower and lateral sides of semiconductor element 80 is upwardly reflected by the light-reflective material, and is emitted from semiconductor device 1.

First electrical connection member 50 and second electrical connection member 60 are bumps disposed on semiconductor element 80. For example, first electrical connection member 50 is connected with the n-type electrode of semiconductor element 80, and second electrical connection member 60 is connected with the p-type electrode of semiconductor element 80. First electrical connection member 50 and second electrical connection member 60 are disposed on a common surface (more specifically, the bottom surface, which is the surface in the negative direction of the Z-axis) of semiconductor element 80.

First electrical connection member 50 and second electrical connection member 60 are connected with different wiring electrodes 20 spaced from each other in a planar view. For this reason, when semiconductor element 80 is flip-chip connected with mounting substrate 10, the bottom surface of semiconductor element 80 is spaced from main surface 150 of mounting substrate 10 to define gap 140.

For example, semiconductor element 80 includes an ohmic electrode (not illustrated) which is in direct contact with the semiconductor layer of semiconductor element 80, and pad electrode 81 and pad electrode 82 which are electrically connected with the ohmic electrode. The ohmic electrode is disposed such that the ohmic electrode is partially covered with an insulating layer having electrical insulation and is partially exposed rather than covered with the insulating layer. Pad electrode 81 and pad electrode 82 are disposed on semiconductor element 80 at an interval approximately identical with the interval between adjacent wiring electrodes 20 so as to correspond to the positions of wiring electrodes 20 on mounting substrate 10.

Any material can be used for first electrical connection member 50 and second electrical connection member 60. The material for first electrical connection member 50 and second electrical connection member 60 may be, for example, an alloy of AuSn solder, or may be a metal composite such as plating bumps made of several metals.

Figure 11:
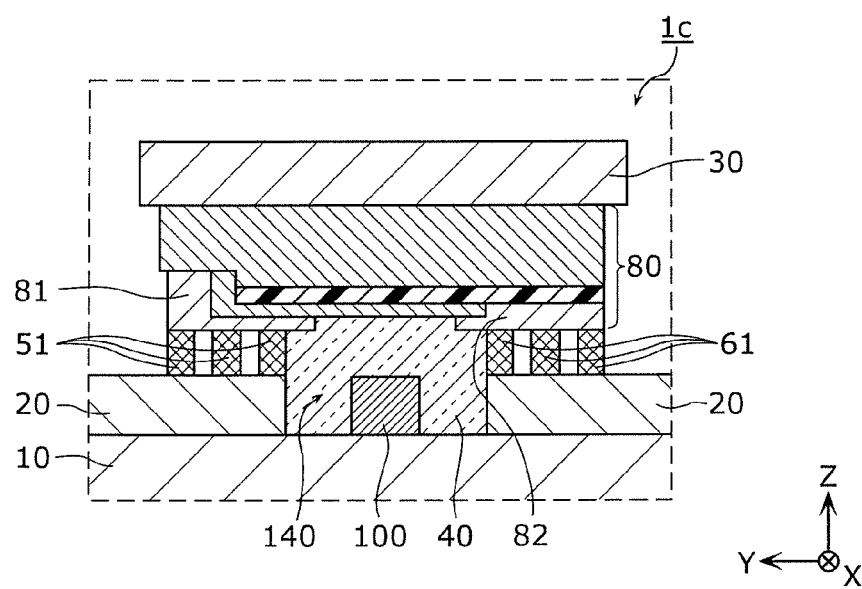
FIG. 11 is a partially enlarged sectional view illustrating a semiconductor device according to Modification 3 of Embodiment 1.

Although FIG. 2 illustrates a case where one first electrical connection member 50 and one second electrical connection member 60 are disposed for one semiconductor element 80, any numbers of first electrical connection members 50 and second electrical connection members 60 can be disposed in one semiconductor element 80. For example, as illustrated in FIG. 11 described later, several first electrical connection members 50 and several second electrical connection members 60 may be disposed in one semiconductor element 80.

Protective element 70 is an element for protecting semiconductor element 80 from application of excessive voltage thereto. Protective element 70 is electrically connected with semiconductor element 80. For example, protective element 70 is disposed over two wiring electrodes 20, and is connected with two wiring electrodes 20 so as to be electrically connected with semiconductor element 80 in parallel. Protective element 70 includes two metal bumps, for example. One of the two metal bumps is connected with one of the two wiring electrodes 20, and the other thereof is connected with the other of the two wiring electrodes 20. In the present embodiment, protective element 70 is connected with the two wiring electrodes 20 having connectors 180, which are connected with an external commercial power supply not illustrated, for example.

Protective element 70 is a Zener diode, a resistor, a varistor, or a capacitor, for example.

Semiconductor element 80 is an element which demonstrates predetermined performance in response to feed of electricity. In the present embodiment, semiconductor element 80 is a light-emitting element such as an LED. Semiconductor element 80 emits blue light, for example. The blue light, which is emitted from semiconductor element 80 as excitation light, causes wavelength converting member 30 to emit fluorescence having a converted wavelength, such as green light, yellow light, or red light. In the present embodiment, semiconductor device 1 includes three semiconductor elements 80. Semiconductor device 1 can include any number of semiconductor elements 80. Semiconductor device 1 may include one semiconductor element 80, or may include several semiconductor elements 80.

Semiconductor element 80 is flip-chip connected with mounting substrate 10 so as to at least partially overlap interposing member 100 in a top surface view.

Semiconductor element 80 includes a gallium nitride (GaN) substrate, a nitride compound semiconductor disposed on the GaN substrate, and first electrical connection member 50 and second electrical connection member 60 disposed on the nitride compound semiconductor, for example. In the case where semiconductor element 80 is flip-chip connected with mounting substrate 10, the GaN substrate is located above first electrical connection member 50 and second electrical connection member 60 in semiconductor device 1. Wavelength converting member 30 overlays the GaN substrate located in an upper portion of semiconductor element 80.

Semiconductor element 80 can be any element other than the light-emitting element such as an LED. Semiconductor element 80 may be a power semiconductor element which controls voltage fed from an external commercial power supply (not illustrated), for example.

Although three semiconductor elements 80 are connected in series in the present embodiment, three semiconductor elements 80 may be connected in any other form. Semiconductor device 1 may include semiconductor elements 80 connected in parallel.

Dam material 90 is an annular member disposed in main surface 150 in the process of producing semiconductor device 1 so as to surround semiconductor element 80 to block resin 40 which would wet spread on main surface 150 of mounting substrate 10.

Dam material 90 is formed from a thermosetting resin having insulation or a thermoplastic resin having insulation, for example. Specifically, examples of the material for dam material 90 include silicone resins and epoxy resins. In the present embodiment, the material for dam material 90 is a white silicone resin containing a thickener dispersed therein. A material other than a resin may be used for dam material 90. Dam material 90 may be a ceramic, for example.

Interposing member 100 is disposed (formed) on mounting substrate 10 in a space (i.e., gap 140) defined by mounting substrate 10, semiconductor element 80, and adjacent wiring electrodes 20 disposed on mounting substrate 10. In the present embodiment, semiconductor device 1 includes three interposing members 100. The three interposing members 100 each are located under a corresponding semiconductor element 80 of the three semiconductor elements 80 (i.e., in gap 140). In other words, semiconductor element 80 at least partially overlaps interposing member 100 in a top surface view. Interposing member 100 is not electrically connected with wiring electrodes 20. Interposing member 100 is not electrically connected with semiconductor element 80. Thus, interposing members 100 are not electrically connected with semiconductor element 80 and wiring electrodes 20, and are electrically independent.

Interposing member 100 has high wettability. More specifically, the wettability of interposing member 100 to resin 40 is higher than that of mounting substrate 10 to resin 40. In other words, interposing member 100 has higher wettability to resin 40 than mounting substrate 10 does. The wettability of interposing member 100 and that on mounting substrate 10 indicate their wettabilities to liquid resin 40 which is not solidified.

Size reduction may be required for semiconductor device 1 in some cases. To reduce the size of semiconductor device 1, adjacent wiring electrodes 20 may have a very narrow interval in some cases. For example, adjacent wiring electrodes 20 are disposed on main surface 150 of mounting substrate 10 at an interval of about 10 μm to 200 μm. The interval between main surface 150 of mounting substrate 10 and the bottom surface of semiconductor element 80 may be very narrow, for example, as narrow as about several micrometers to several dozen micrometers. For this reason, in the case where semiconductor element 80 is flip-chip connected with mounting substrate 10 and then is encapsulated with resin 40, resin 40 is difficult to wet spread into gap 140, which is the space between adjacent wiring electrodes 20 and between mounting substrate 10 and semiconductor element 80. For this reason, it takes a long time to fill gap 140 with resin 40. Interposing member 100 improves the wet spreading rate of resin 40 into gap 140 because the wettability of interposing member 100 to resin 40 is higher than that of mounting substrate 10.

Interposing member 100 can be formed from any material. Examples of the material for interposing member 100 include ceramic and metallic materials. To improve the wettability, the material for interposing member 100 may be one selected from the group consisting of Au, Al, and Cu. The entire interposing member 100 may be formed from one metallic material selected from the group consisting of Au, Al, and Cu. Alternatively, interposing member 100 may be, for example, a member including a substrate made of a ceramic or a metal, for example, and a metal coating formed on the surface of the substrate through plating of one metal selected from the group consisting of Au, Al, and Cu. Thus, the surface of interposing member 100 may be formed from one selected from the group consisting of Au, Al, and Cu.

Wiring electrode 20 may be formed from a material different from that for interposing member 100. Alternatively, wiring electrode 20 may be formed from the same material as that for interposing member 100. In the case where interposing member 100 is configured to include a metal such as Au, Al, or Cu disposed on the surface of a ceramic or metal substrate, the material for the metal disposed on the surface of interposing member 100 may be the same as the metal material used for wiring electrode 20.

Interposing member 100 has an elongated shape such as a cuboid. In the present embodiment, interposing member 100 has a band-like shape having a uniform width in a top surface view. Interposing member 100 is disposed on main surface 150 of mounting substrate 10 so as to at least partially overlap semiconductor element 80 in a top surface view. More specifically, interposing member 100 is disposed in gap 140. In addition, for example, the longitudinal direction of interposing member 100 crosses the alignment direction of adjacent wiring electrodes 20. More specifically, the longitudinal direction of interposing member 100 may be the direction intersecting perpendicular to the alignment direction of adjacent wiring electrodes 20. Alternatively, for example, the longitudinal direction of interposing member 100 is the direction crossing the alignment direction of first electrical connection member 50 and second electrical connection member 60.

The length (that is, the width) of the direction intersecting perpendicular to the longitudinal direction of interposing member 100 in a top surface view may or may not be uniform. Although one interposing member 100 is disposed under one semiconductor element 80 in the present embodiment, any number of interposing members 100 can be disposed under one semiconductor element 80. One interposing member 100 or two or more interposing members 100 may be disposed under one semiconductor element 80.

Interposing member 100 may be disposed in mounting substrate 10 in contact with wiring electrode 20 or spaced from wiring electrode 20. In other words, interposing member 100 does not need to be in contact with wiring electrode 20. Interposing member 100 also does not need to be in contact with semiconductor element 80. In particular, in the case where interposing member 100 has a surface formed from a metallic material, interposing member 100 may be spaced from wiring electrode 20 to prevent electrical connection with wiring electrode 20.

Interposing member 100 may be disposed between pad electrode 81 and pad electrode 82 of semiconductor element 80.

[Production Method]

The method of producing semiconductor device 1 according to Embodiment 1 will now be described with reference to FIGS. 5 to 7.

Figure 5:
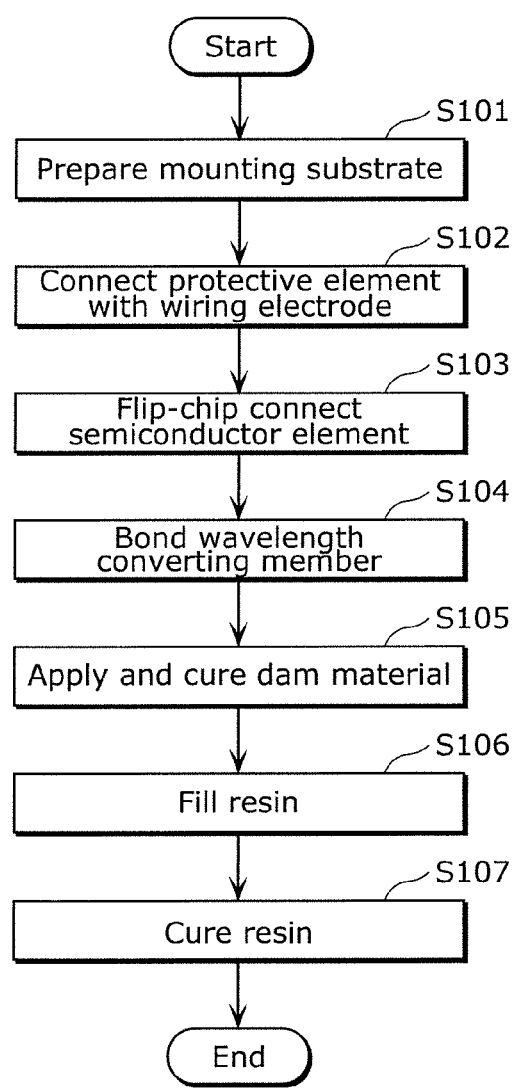
FIG. 5 is a flowchart for illustrating a method of producing the semiconductor device according to Embodiment 1.

FIG. 5 is a flowchart illustrating the method of producing semiconductor device 1 according to Embodiment 1.

First, mounting substrate 10 is prepared (step S101). Specifically, an AlN substrate formed from sintered AlN is used for mounting substrate 10, for example. Wiring electrode 20 made of Au is formed on mounting substrate 10 by plating, for example. Adjacent wiring electrodes 20 have an interval of 150 µm, for example. In the next step, interposing member 100 is formed between adjacent wiring electrodes 20. Specifically, band-shaped interposing member 100 made of Au and having a width of 50 µm is disposed on mounting substrate 10 with intervals of 50 µm from two adjacent wiring electrodes 20. Thus, in step S101, wiring electrodes 20 (more specifically, the first wiring electrode and the second wiring electrode) and interposing member 100 disposed between the first wiring electrode and the second wiring electrode are formed on main surface 150 of mounting substrate 10.

In the case where interposing member 100 is formed from the same material as that for wiring electrode 20, mounting substrate 10 not having wiring electrode 20 may be prepared, and interposing member 100 together with wiring electrode 20 may be formed on mounting substrate 10 when wiring electrode 20 is formed on mounting substrate 10. Thus, interposing member 100 can be arranged on mounting substrate 10 without any separate equipment for arranging interposing member 100 on mounting substrate 10.

In the next step, protective element 70 is connected with wiring electrodes 20 (step S102). Specifically, protective element 70 is flip-chip connected with two wiring electrodes 20 having connectors 180. Protective element 70 is connected with two wiring electrodes 20 by ultrasonic welding, for example. Protective element 70 is connected with two wiring electrodes 20 so as to be electrically connected with semiconductor element 80 in parallel, for example.

In the next step, semiconductor element 80 is flip-chip connected with mounting substrate 10 (step S103). More specifically, semiconductor element 80 is flip-chip connected with mounting substrate 10 via two adjacent wiring electrodes 20 (the first wiring electrode and the second wiring electrode). Thus, semiconductor element 80 and mounting substrate 10 are connected at an interval of 7 µm, for example. Semiconductor element 80 to be used is a blue LED chip including a GaN or sapphire substrate and a nitride compound semiconductor disposed thereon, for example.

First electrical connection member 50 and second electrical connection member 60 are formed on semiconductor element 80 through deposition, for example. First electrical connection member 50 and second electrical connection member 60 are formed from an AuSn alloy, for example, and a layer of AuSn alloy is formed on semiconductor element 80 through deposition. In step S103, semiconductor element 80 including first electrical connection member 50 and second electrical connection member 60 formed as the layer of AuSn alloy is placed onto wiring electrodes 20 in mounting substrate 10 with the growth substrate (for example, a GaN substrate) facing upward and first electrical connection member 50 and second electrical connection member 60 facing downward such that first electrical connection member 50 and second electrical connection member 60 are in contact with different wiring electrodes 20. Furthermore, first electrical connection member 50 and second electrical connection member 60 are electrically connected to wiring electrode 20 through reflow to flip-chip connect semiconductor element 80 with mounting substrate 10.

In the next step, wavelength converting member 30 is bonded to semiconductor element 80 with a transparent adhesive (not illustrated) (step S104).

Dam material 90 is then formed on main surface 150 of mounting substrate 10 so as to surround semiconductor element 80 in a top surface view (step S105). Specifically, a highly viscous (for example, pasty) resin is applied onto mounting substrate 10 in a thin linear and annular form, and is cured. Thus, dam material 90 for blocking resin 40 is formed in mounting substrate 10 to prevent the wet spreading of resin 40 to the outside of mounting substrate 10 when resin 40 is dropped onto mounting substrate 10 in the next step.

In the next step, resin 40 is filled into a space between mounting substrate 10 and semiconductor element 80 flip-chip connected with mounting substrate 10, the space extending along interposing member 100 (step S106). Specifically, resin 40 is dropped onto and filled into a region of mounting substrate 10 surrounded by dam material 90 to encapsulate semiconductor element 80. More specifically, resin 40 having light-reflectivity and low viscosity is dropped into a space between semiconductor element 80 and dam material 90. Thus, resin 40 is filled into gap 140, which is a space between adjacent wiring electrodes 20 and between the lower portion of semiconductor element 80 and main surface 150 of mounting substrate 10. Resin 40 is also filled into lateral regions of semiconductor element 80. Thus, semiconductor element 80 is encapsulated by resin 40. In the present embodiment, resin 40 used in step S106 is a dimethyl silicone resin containing light-reflective $TiO_2$ particles having a particle diameter of about several micrometers and having a viscosity at 20° C. of 10 Pa·s to 15 Pa·s. Resin 40 in step S106 is a liquid not solidified.

Figure 6:
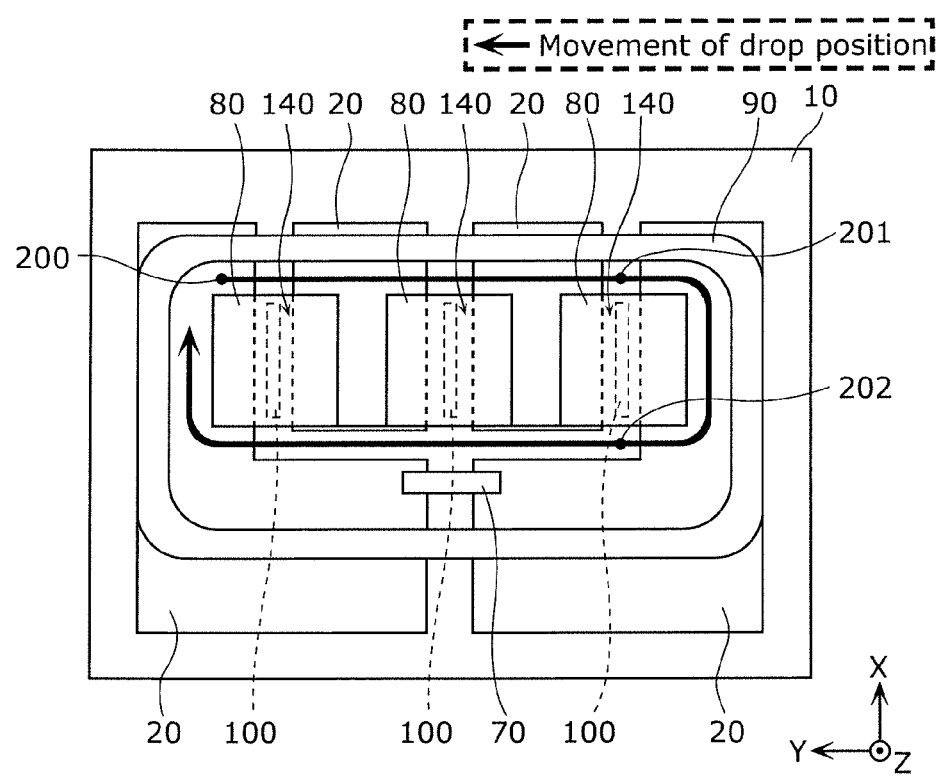
FIG. 6 is a diagram illustrating filling of a resin into a space in a process of producing the semiconductor device according to Embodiment 1.

FIG. 6 is a diagram illustrating a step of filling resin 40 into a space in the process of producing semiconductor device 1 according to Embodiment 1 (more specifically, step S106 illustrated in FIG. 5).

Resin 40 is dropped while a resin dropping nozzle (not illustrated) which ejects resin 40 is being moved in the horizontal direction, for example. The resin dropping nozzle has an inner diameter of 0.25 mm, for example, and has a moving rate of 3 mm/s, for example.

In the present embodiment, semiconductor element 80 has a rectangular shape in a top surface view, and semiconductor element 80 has four sides having a length of 1.0 mm, for example. For this reason, for example, in the case where dropping of resin 40 is started from drop position 200 as illustrated in the movement of the drop position of resin 40 indicated by the arrow in FIG. 6, resin 40 is dropped onto drop position 202 about 0.7 seconds after resin 40 is dropped onto drop position 201. Semiconductor element 80 can have any shape in a top surface view. The shape of semiconductor element 80 in a top surface view may be rectangular or may be polygonal, for example.

In the present embodiment, gap 140 has open ends in the X-axial direction so as to allow the wet spreading of resin 40. Resin 40 wet spreads from one end of gap 140 in the X-direction (more specifically, the end close to drop position 201) into gap 140. When gap 140, which is a narrow and elongated region surrounded by semiconductor element 80 and mounting substrate 10 is not completely filled with resin 40 (more specifically, an underfilling resin which is resin 40 located between semiconductor element 80 and mounting substrate 10) within the time from dropping of resin 40 onto drop position 201 to dropping of resin 40 onto drop position 202, for example, in about 0.7 seconds in the present embodiment, resin 40 would be introduced from the other end of gap 140 in the negative X-axial direction into gap 140. For this reason, air is undesirably left in gap 140. In other words, an unfilled region not filled with resin 40 where air is left is generated in gap 140. In the present embodiment, the generation of the unfilled region is prevented by improving the wet spreading rate of resin 40 using interposing member 100.

Figure 7:
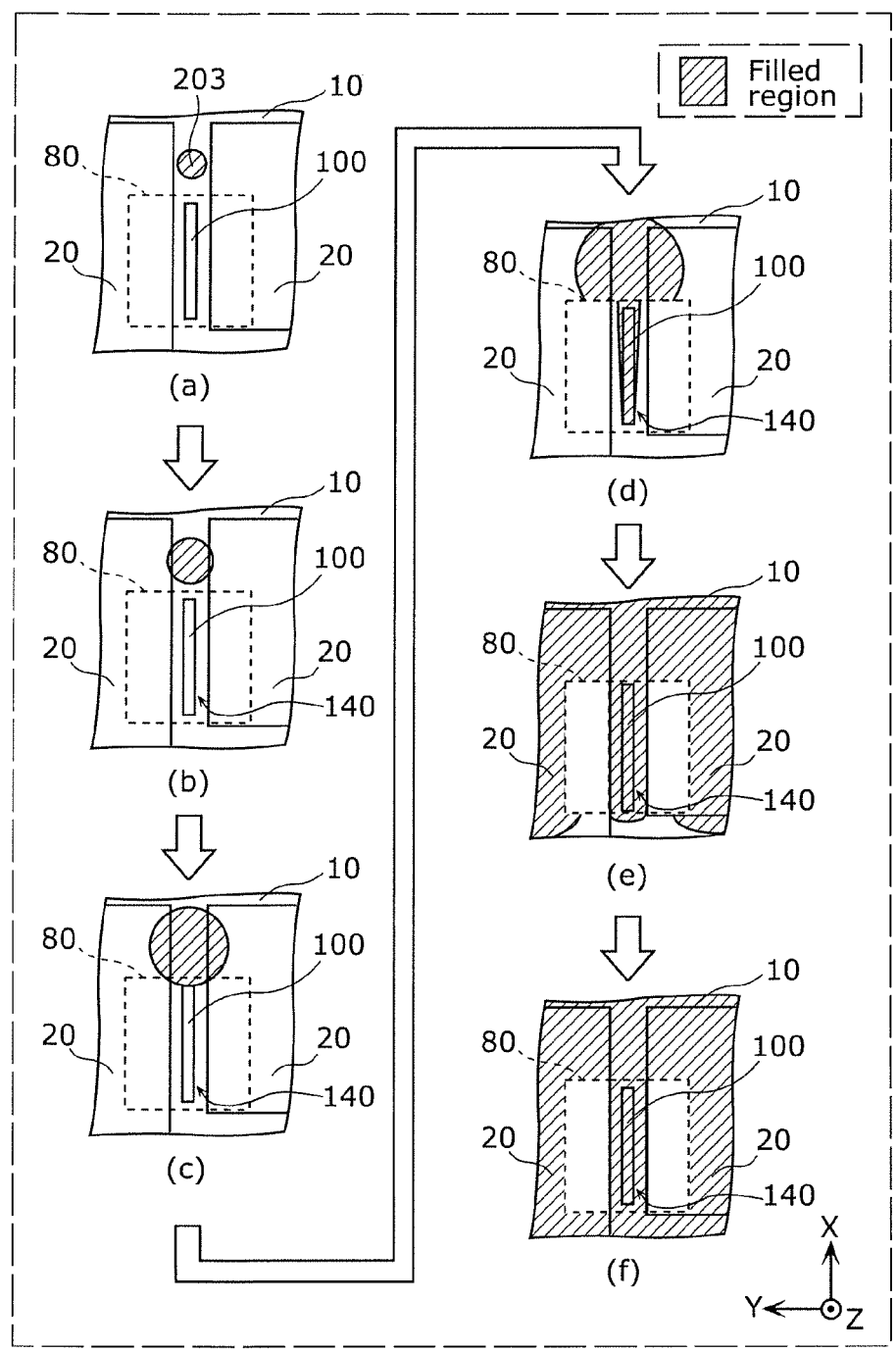
FIG. 7 is a diagram illustrating how the resin wet spreads in the process of producing the semiconductor device according to Embodiment 1.

FIG. 7 is a diagram illustrating how resin 40 wet spreads in the process of producing semiconductor device 1 according to Embodiment 1. FIG. 7 is a partially enlarged top view of two adjacent wiring electrodes 20 (that is, the first wiring electrode and the second wiring electrode) and interposing member 100 disposed therebetween, where semiconductor element 80 is schematically illustrated with the dashed line in the position where semiconductor element 80 is arranged. FIG. 7 also schematically illustrates a filled region with hatching, which is a region of resin 40 located on mounting substrate 10. In FIG. 7, the position from which resin 40 is dropped onto mounting substrate 10 is fixed at drop position 203.

As illustrated in (a) of FIG. 7, resin 40 is first dropped onto drop position 203 of mounting substrate 10. Resin 40 then isotropically wet spreads on mounting substrate 10 as illustrated in (b) of FIG. 7. Assume that resin 40 is then brought in contact with interposing member 100 as illustrated in (c) of FIG. 7. In this case, resin 40 brought in contact with interposing member 100 then wet spreads along interposing member 100 as illustrated in (d) of FIG. 7, rather than isotropically wet spreads. Resin 40 brought in contact with interposing member 100 also wet spreads to the outside of interposing member 100 as illustrated in (e) of FIG. 7. Resin 40 also wet spreads to the outside of semiconductor element 80 in a top surface view. Here, as illustrated in (e) of FIG. 7, before resin 40 which wet spreads to the outside of semiconductor element 80 in a top surface view wet spreads to the end of gap 140 in the negative X-axial direction, resin 40 which wet spreads in gap 140 wet spreads to the end of gap 140 in the negative X-axial direction. As illustrated in (f) of FIG. 7, gap 140 is filled with resin 40 without the air contained.

With reference to FIG. 5 again, in the step subsequent to step S106, after the dropping of resin 40 is completed, resin 40 is left as it is until the surface (more specifically, the top surface) of resin 40 becomes substantially flat due to its weight. Semiconductor device 1 is then heated in an oven to cure (i.e., solidify) resin 40 (step S107). Examples of a treatment of curing resin 40 includes heating of semiconductor device 1 (more specifically, resin 40) at 150° C. for 3 hours.

Semiconductor device 1 is produced through the steps above.

[Effects]

As described above, semiconductor device 1 according to Embodiment 1 includes mounting substrate 10; a first wiring electrode and a second wiring electrode disposed on main surface 150 of mounting substrate 10, the first wiring electrode being one of two wiring electrodes 20 connected with a common semiconductor element 80 among several wiring electrodes 20 and the second wiring electrode being the other thereof; interposing member 100 disposed between the first wiring electrode and the second wiring electrode; semiconductor element 80 which is flip-chip connected with the first wiring electrode and the second wiring electrode via first electrical connection member 50 and second electrical connection member 60 and at least partially overlaps interposing member 100 in a top surface view; and resin 40 disposed in contact with semiconductor element 80 and mounting substrate 10. The wettability of interposing member 100 to resin 40 is higher than that of mounting substrate 10 to resin 40. Resin 40 is disposed in contact with semiconductor element 80 and interposing member 100.

In such a configuration, interposing member 100 accelerates the wet spreading rate of resin 40 in gap 140 compared to the wet spreading rate of resin 40 on main surface 150 of mounting substrate 10 other than gap 140 when resin 40 is filled into gap 140 which is a region surrounded by main surface 150 of mounting substrate 10, semiconductor element 80, and two wiring electrodes 20. For this reason, interposing member 100 disposed in gap 140 allows resin 40 to be filled into gap 140 faster than in the case where interposing member 100 is not disposed in gap 140. Thus, invasion of air into gap 140, which is caused by resin 40 filled into gap 140 from several directions around gap 140, can be prevented. For this reason, such a configuration can prevent breakdown of semiconductor device 1 caused by expansion of the air in gap 140 due to heat. Moreover, debris are not generated by the processing such as cutting away of main surface 150 of mounting substrate 10 because such processing is not necessary. Thus, breakdown of semiconductor device 1 caused by debris is prevented.

Interposing member 100 is spaced from the first wiring electrode and the second wiring electrode, for example.

In such a configuration, for example, while gap 140 in a top surface view has a narrow and elongated shape through which resin 40 is difficult to wet spread, interposing member 100 has a narrower elongated shape than that of gap 140 in a top surface view because interposing member 100 is spaced from the first wiring electrode and the second wiring electrode. Such a narrow and elongated shape of interposing member 100 generates directionality in diffusion of resin 40 (that is, the direction of wet spreading). For this reason, resin 40 can be effectively filled by interposing member 100 from the starting point to a remote point in filling of resin 40 into gap 140. In addition, the space through which resin 40 wet spreads can be increased by spacing interposing member 100 from the first wiring electrode and the second wiring electrode. Such a space further facilitates the wet spreading of resin 40 into gap 140.

The first wiring electrode, the second wiring electrode, and interposing member 100 are made of the same material, for example. Specifically, wiring electrode 20 and interposing member 100 are made of the same material.

In such a configuration, interposing member 100 can be formed on main surface 150 of mounting substrate 10 without using a new apparatus or the like in the step of forming wiring electrode 20 on main surface 150 of mounting substrate 10.

Main surface 150 of mounting substrate 10 is formed from one selected from the group consisting of AlN, $Al_2O_3$, BeO, SiC, $SiO_2$, and $Si_3N_4$, for example. The surface of interposing member 100 is formed from one selected from the group consisting of Au, Al, and Cu, for example. Resin 40 contains at least one selected from the group consisting of silicone resins and epoxy resins, for example.

Such a configuration increases the difference between the wettability of main surface 150 of mounting substrate 10 to resin 40 and that of interposing member 100 to resin 40. For this reason, interposing member 100 can further accelerate filling of resin 40 into gap 140.

The present inventors, who have conducted extensive research, have found that in the case where AlN is used as the material for mounting substrate 10, Au is used as the material for interposing member 100, and a silicone resin is used as the material for resin 40, interposing member 100 further facilitates the wet spreading of resin 40 in gap 140 in particular. For this reason, mounting substrate 10 may be made of AlN, interposing member 100 may be made of Au, and resin 40 may be made of a silicone resin. In such a configuration, interposing member 100 further facilitates the wet spreading of resin 40 in gap 140.

The method of producing semiconductor device 1 according to Embodiment 1 includes forming a first wiring electrode, a second wiring electrode, and interposing member 100 disposed between the first wiring electrode and the second wiring electrode on main surface 150 of mounting substrate 10; flip-chip connecting semiconductor element 80 with the first wiring electrode and the second wiring electrode via first metal connection member 50 and second metal connection member 60 such that semiconductor element 80 at least partially overlaps interposing member 100 in a top surface view; and filling resin 40 into a space between mounting substrate 10 and semiconductor element 80 flip-chip connected with mounting substrate 10, the space extending along interposing member 100.

According to such a production method, when resin 40 is filled from any of the surrounding region of gap 140, for example, resin 40 is filled into gap 140 faster than in the case where interposing member 100 is not disposed, for example. Thus, the invasion of air into gap 140, which is caused by resin 40 filled into gap 140 from several directions around gap 140, can be prevented. For this reason, such a production method can produce semiconductor device 1 whose breakdown caused by thermal expansion of air invaded into gap 140 is prevented. Moreover, debris are not generated by the processing such as cutting away of main surface 150 of mounting substrate 10 because such processing is not necessary. This results in semiconductor device 1 whose breakdown caused by debris is prevented.

MODIFICATIONS

Modifications of semiconductor device according to Embodiment 1 will now be described. In the modifications described below, differences from the components included in semiconductor device according to Embodiment 1 will be mainly described, and the description of identical components will be simplified or omitted in some cases.

Modification 1

Figure 8:
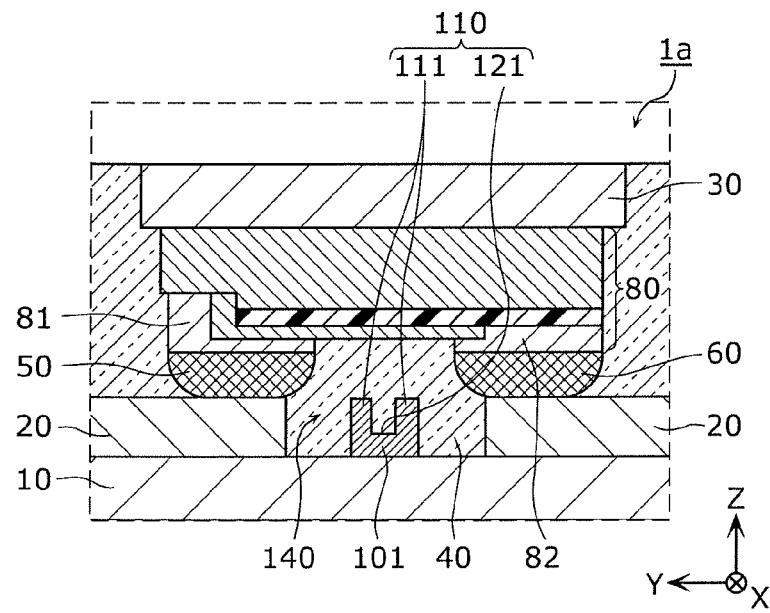
FIG. 8 is a partially enlarged sectional view illustrating a semiconductor device according to Modification 1 of Embodiment 1.
Figure 9:
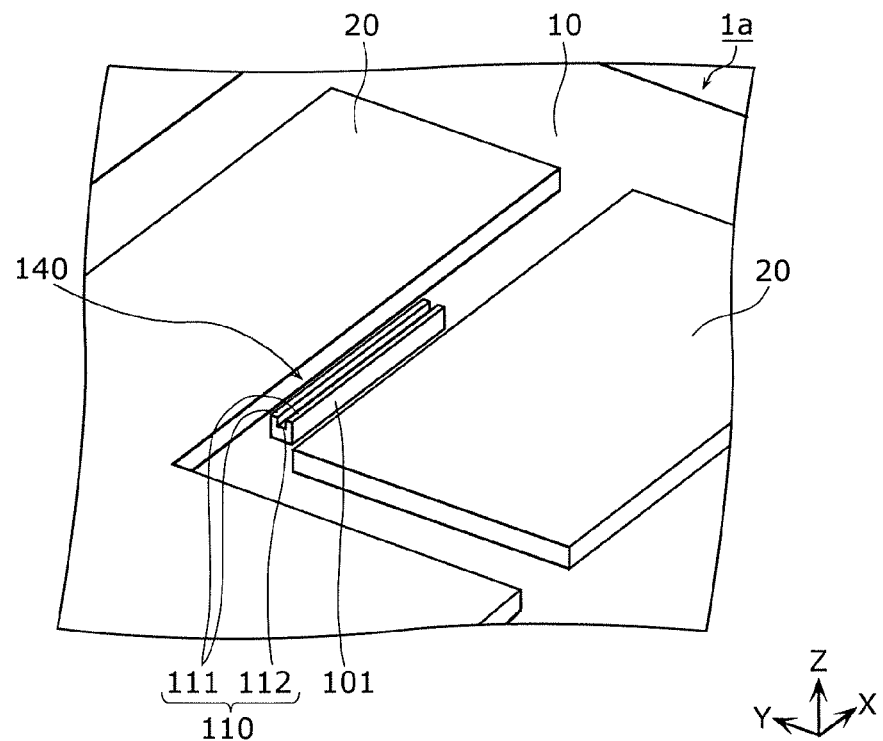
FIG. 9 is a partially enlarged perspective view illustrating the semiconductor device according to Modification 1 of Embodiment 1.

FIG. 8 is a partially enlarged sectional view illustrating semiconductor device 1a according to Modification 1 of Embodiment 1. FIG. 9 is a partially enlarged perspective view illustrating semiconductor device 1a according to Modification 1 of Embodiment 1. The sectional view illustrated in FIG. 8 is a schematic illustration of an enlarged view of the same cross-section as that in the sectional view illustrated in FIG. 3. In the partially enlarged perspective view illustrated in FIG. 9, mounting substrate 10, two adjacent wiring electrodes 20, and interposing member 101 are illustrated while some of components such as semiconductor element 80 and resin 40 are omitted for description.

Unlike semiconductor device 1, semiconductor device 1a includes interposing member 101 having a shape different from that of interposing member 100 included in semiconductor device 1. Specifically, as illustrated in FIGS. 8 and 9, an uneven shape is formed on the surface of interposing member 101 to improve the wettability.

Interposing member 101 has uneven portion 110 on its elongated surface facing semiconductor element 80 (more specifically, the upper surface), for example, and uneven portion 110 includes one or more projections 111 projecting toward semiconductor element 80. In the present modification, interposing member 101 has two projections 111, and recess 112 defined by these two projections 111 and located between two projections 111.

For example, projection 111 extends along the longitudinal direction of interposing member 101. In other words, projection 111 is disposed in interposing member 101 so as to extend along gap 140, for example. The extending direction of projection 111 along the longitudinal direction of interposing member 101 is aligned along the direction crossing the alignment direction of adjacent wiring electrodes 20, for example.

Thus, interposing member 101 has uneven portion 110 which is disposed on the surface facing semiconductor element 80 and has one or more projections 111 projecting toward semiconductor element 80, for example.

In such a configuration, uneven portion 110 increases the contact area of interposing member 101 in contact with resin 40, compared to the contact area thereof in contact with resin 40 in the case where uneven portion 110 is not disposed. For this reason, uneven portion 110 can increase the amount of resin 40 to be brought in contact with interposing member 101, so that uneven portion 110 can increase the wettability and a larger amount of resin 40 can be filled into gap 140 faster. Moreover, because interposing member 101 having an elongated shape along gap 140 is disposed, resin 40 can be readily filled into gap 140 along interposing member 101 even if gap 140 is an elongated and narrow gap, for example. In addition, because projection 111 extends along the longitudinal direction of interposing member 101, resin 40 brought into contact with projection 111 readily wet spreads into gap 140 along the longitudinal direction of interposing member 101, rather than isotropically wet spreads. For this reason, because interposing member 101 has an elongated shape and has projection 111 extending along the longitudinal direction of interposing member 101, resin 40 can be filled into gap 140 faster, even if gap 140 is an elongated and narrow shape, for example. For this reason, the invasion of the air into gap 140, which is caused after filling of resin 40 into gap 140 from all the directions, can be further prevented. Thus, breakdown of semiconductor device 1 caused by thermal expansion of the air invaded in gap 140 can be further prevented.

Interposing member 101 can have any number of projections 111. Interposing member 101 can have one projection 111 or may have two or more projections 111. While projection 111 illustrated in the present modification continuously extends to both ends of interposing member 101 (specifically, both ends in the X-axial direction) along the longitudinal direction of interposing member 101, projection 111 can have any length in the longitudinal direction of interposing member 101. Although projection 111 has a rectangular shape in a top surface view, for example, projection 111 can have any shape. For example, projection 111 may have a circular, oval, or polygonal shape in a top surface view.

Modification 2

Figure 10:
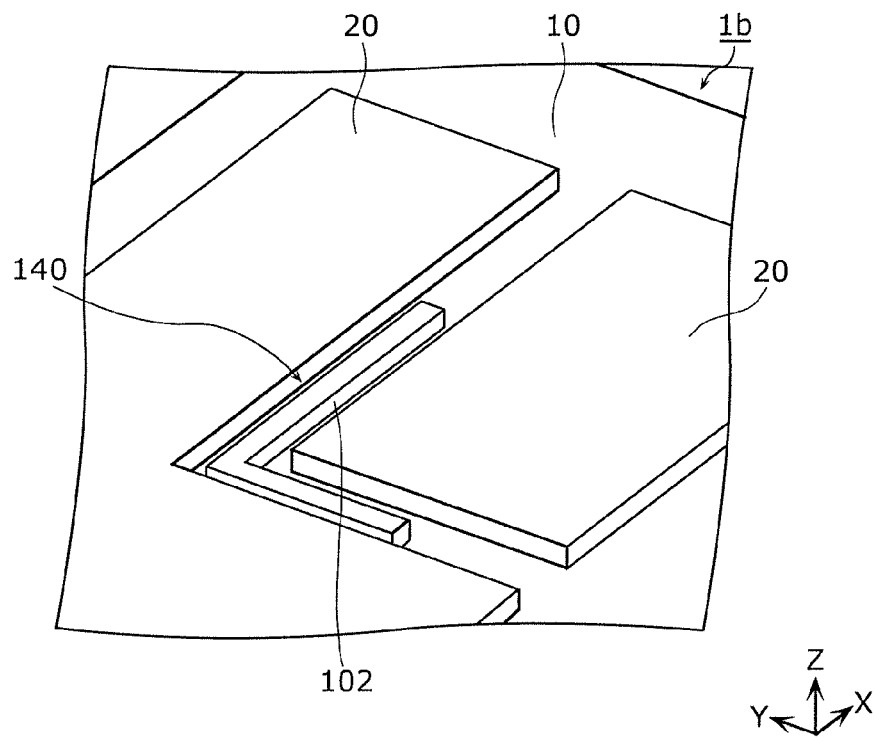
FIG. 10 is a partially enlarged perspective view illustrating a semiconductor device according to Modification 2 of Embodiment 1.

FIG. 10 is a partially enlarged perspective view illustrating semiconductor device 1b according to Modification 2 of Embodiment 1. In the partially enlarged perspective view illustrated in FIG. 10, mounting substrate 10, two adjacent wiring electrodes 20, and interposing member 102 are illustrated, and some of components such as semiconductor element 80 and resin 40 are omitted for description.

Unlike semiconductor device 1, semiconductor device 1b includes interposing member 102 having a different shape from that of interposing member 100 included in semiconductor device 1. Specifically, as illustrated in FIG. 10, interposing member 102 is a bent shape in a top surface view, rather than a linear band shape which interposing member 100 has. In FIG. 10, interposing member 102 is bent in an L-shape so as to correspond to the shape of the space between two adjacent wiring electrodes 20. Thus, interposing member 102 can have any shape in a top surface view.

Modification 3

FIG. 11 is a partially enlarged sectional view illustrating semiconductor device 1c according to Modification 3 of Embodiment 1. The sectional view illustrated in FIG. 11 schematically illustrates an enlarged view of the same cross-section as that in the sectional view illustrated in FIG. 3.

Unlike semiconductor device 1, semiconductor device 1c includes first electrical connection member 51 and second electrical connection member 61 which are different from first electrical connection member 50 and second electrical connection member 60 included in semiconductor device 1. Specifically, as illustrated in FIG. 11, semiconductor device 1c includes three first electrical connection members 51 and three second electrical connection members 61 in a cross-sectional view. Thus, one semiconductor element 80 may include several first electrical connection members 50 and several second electrical connection members 60. Three first electrical connection members 51 and three second electrical connection members 61 are connected with their corresponding wiring electrodes 20, respectively.

Although resin 40 located in the Y-axial direction of semiconductor element 80 is not illustrated in FIG. 11, unlike FIG. 3, for example, resin 40 may or may not be disposed in the Y-axial direction of semiconductor element 80. In FIG. 11, gaps are disposed between adjacent first electrical connection members 51 and between adjacent second electrical connection members 61. The gaps may be filled with resin 40.

Modification 4

Figure 12:
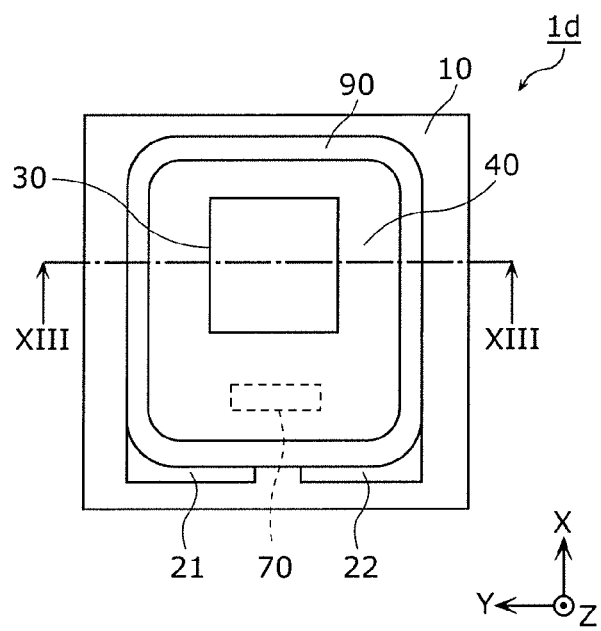
FIG. 12 is a top view illustrating a semiconductor device according to Modification 4 of Embodiment 1.
Figure 13:
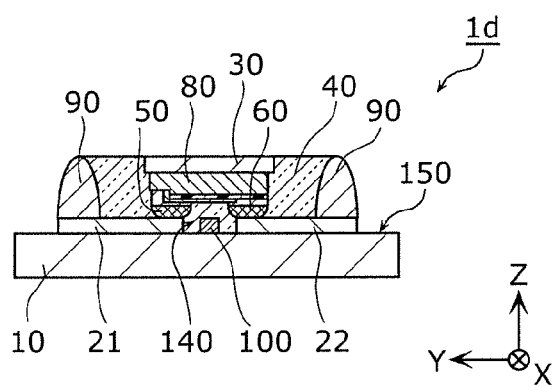
FIG. 13 is a sectional view illustrating the semiconductor device according to Modification 4 of Embodiment 1 taken along line XIII-XIII of FIG. 12.

FIG. 12 is a top view illustrating semiconductor device 1d according to Modification 4 of Embodiment 1. FIG. 13 is a sectional view illustrating semiconductor device 1d according to Modification 4 of Embodiment 1 taken along line XIII-XIII of FIG. 12.

Unlike semiconductor device 1, semiconductor device 1d includes one semiconductor element 80 and one wavelength converting member 30. In other words, the number of semiconductor elements 80 and the number of wavelength converting members 30 included in semiconductor device 1d are different from those in semiconductor device 1. Thus, semiconductor device 1d can include these components in any number.

Semiconductor device 1d includes two wiring electrodes 21 and 22 disposed on mounting substrate 10. Similarly to wiring electrode 20, wiring electrode (first wiring electrode) 21 and wiring electrode (second wiring electrode) 22 are patterned wirings disposed on main surface 150 of mounting substrate 10 and electrically connected with semiconductor element 80. More specifically, semiconductor device 1d includes first wiring electrode 21 disposed on main surface 150 of mounting substrate 10, second wiring electrode 22 disposed on main surface 150 of mounting substrate 10, and interposing member 100 disposed between first wiring electrode 21 and second wiring electrode 22. Thus, wiring electrodes 21 and 22 disposed on mounting substrate 10 may be appropriately varied according to the number of semiconductor elements 80 and the shape thereof.

Embodiment 2

The semiconductor device according to Embodiment 2 will now be described. In the description of the semiconductor device according to Embodiment 2, differences from semiconductor device 1 according to Embodiment 1 will be mainly described, identical referential numerals are given to identical configurations with those in semiconductor device 1 according to Embodiment 1, and their description will be omitted in some cases.

[Configuration]

Figure 14:
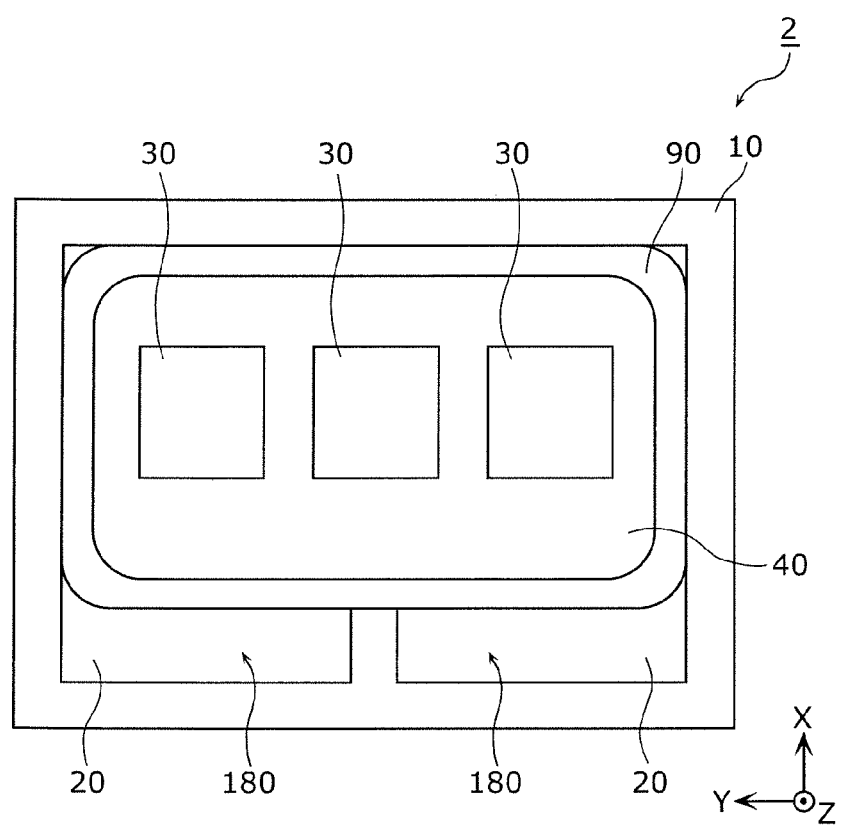
FIG. 14 is a top view illustrating a semiconductor device according to Embodiment 2.
Figure 15:
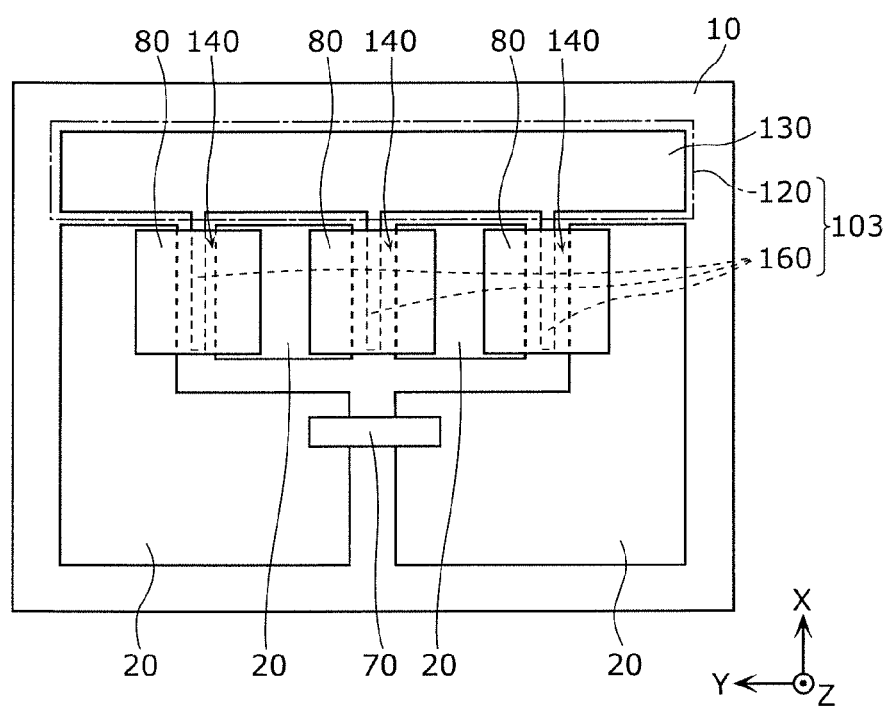
FIG. 15 is a top view illustrating an interposing member included in the semiconductor device according to Embodiment 2.

FIG. 14 is a top view illustrating semiconductor device 2 according to Embodiment 2. FIG. 15 is a top view illustrating interposing member 103 included in semiconductor device 2 according to Embodiment 2. In FIG. 15, the illustration of wavelength converting member 30 and resin 40 included in semiconductor device 2 are omitted.

Similarly to semiconductor device 1 according to Embodiment 1 illustrated in FIGS. 1 to 4, for example, semiconductor device 2 according to Embodiment 2 includes mounting substrate 10, at least two wiring electrodes 20, wavelength converting member 30, resin 40, first electrical connection member 50, second electrical connection member 60, protective element 70, semiconductor element 80, and dam material 90. Semiconductor device 2 according to Embodiment 2 includes interposing member 103 and wiring electrode 20 having different shapes from those in semiconductor device 1 according to Embodiment 1.

As illustrated in FIG. 15, semiconductor device 2 according to Embodiment 2 includes interposing member 103 having extension 120 having wide portion 130.

Interposing member 103 is disposed (formed) on mounting substrate 10 in a space defined by mounting substrate 10, semiconductor element 80, and adjacent wiring electrodes 20 disposed on mounting substrate 10 (that is, gap 140). Interposing member 103 is a member having a wettability. The wettability of interposing member 103 to resin 40 is higher than that of mounting substrate 10 to resin 40. Interposing member 103, which has higher wettability, plays a role in improving the flow rate of resin 40 in gap 140.

Interposing member 103 includes interposers 160 each disposed in gap 140 between two adjacent wiring electrodes 20 and between mounting substrate 10 and semiconductor element 80; and extension 120 which extends from interposers 160 and is located outside semiconductor element 80 in a top surface view, in other words, does not overlap semiconductor element 80 in a top surface view. Extension 120 illustrated in FIG. 15 has wide portion 130 wider than the interval between two adjacent wiring electrodes 20. In other words, the width of wide portion 130 in the Y-axial direction is wider than the interval between the first wiring electrode and the second wiring electrode. In the present embodiment, semiconductor device 2 includes one interposing member 103 including three interposers 160 located under three semiconductor elements 80, respectively, and one wide portion 130 connected with three interposers 160.

Interposer 160 has an elongated shape, such as a cuboid. Interposer 160 is part of interposing member 103 and overlaps semiconductor element 80 in a top surface view. More specifically, interposer 160 is disposed in gap 140, for example. For example, the longitudinal direction of interposer 160 crosses the alignment direction of wiring electrodes 20. The longitudinal direction of interposer 160 may be the direction intersecting perpendicular to the alignment direction of wiring electrodes 20. Alternatively, the longitudinal direction of interposer 160 may be the direction crossing the alignment direction of first electrical connection member 50 and second electrical connection member 60.

For example, interposer 160 is spaced from wiring electrodes 20. More specifically, interposer 160 is spaced from the first wiring electrode and the second wiring electrode, which are two adjacent wiring electrodes 20 connected with a common semiconductor element 80.

Extension 120 is part of interposing member 103 located outside semiconductor element 80 in a top surface view. More specifically, extension 120 is part of interposing member 103, and is formed continuously with interposer 160 in a position where extension 120 does not overlap semiconductor element 80 in a top surface view.

Extension 120 has wide portion 130, for example.

Wide portion 130 is part of extension 120, and in a top surface view, has a width in the Y-axial direction larger than the distance of the space between two adjacent wiring electrodes 20 (that is, the first wiring electrode and the second wiring electrode) connected with a common semiconductor element 80. For example, wide portion 130 has a width larger than the distance of the space between adjacent wiring electrodes 20. More specifically, in the alignment direction of wiring electrodes 20, wide portion 130 has a width larger than the interval between two adjacent wiring electrodes 20, in other words, the interval between the first wiring electrode and the second wiring electrode.

Interposing member 103 can be formed from any material. Examples of the material for interposing member 103 include ceramic and metallic materials. From the viewpoint of the wettability, the surface of interposing member 103 may be formed from one selected from the group consisting of Au, Al, and Cu. Interposing member 103 may be, for example, a member including a substrate made of a ceramic or metal, and a metal coating formed on the surface of the substrate subjected to plating with one metal selected from the group consisting of Au, Al, and Cu. Wiring electrode 20 and interposing member 103 may be formed from the same material.

Similarly to interposing member 101 illustrated in FIG. 8, interposing member 103 may have uneven portion 110, for example. Uneven portion 110 may be disposed in interposer 160, for example.

Interposing member 103 does not need to be one interposing member 103 having the number of interposers 160 according to the number of semiconductor elements 80, that is, the number of gaps 140. Semiconductor device 2 may have a plurality of interposing members having interposers 160 and extensions 120 according to a corresponding plurality of semiconductor elements 80. Alternatively, semiconductor device 2 may have a plurality of interposers 160 and a plurality of wide portions 130 according to a corresponding plurality of semiconductor elements 80, for example.

[Production Method]

The method of producing semiconductor device 2 according to Embodiment 2 will now be described. Because the method of producing semiconductor device 2 according to Embodiment 2 is substantially the same as the method of producing semiconductor device 1 according to Embodiment 1 except for the step of filling resin 40 into a space (step S106 illustrated in FIG. 5), the description thereof will be omitted or simplified in some cases.

First, steps S101 to S105 are executed in the same manner as in the method of producing semiconductor device 1 illustrated in FIG. 5.

In the next step, resin 40 is filled between mounting substrate 10 and semiconductor element 80 flip-chip connected with mounting substrate 10, the space extending along interposing member 103 (step S106). Here, in the method of producing semiconductor device 2 according to Embodiment 2, resin 40 is dropped onto extension 120, more specifically, wide portion 130.

Figure 16:
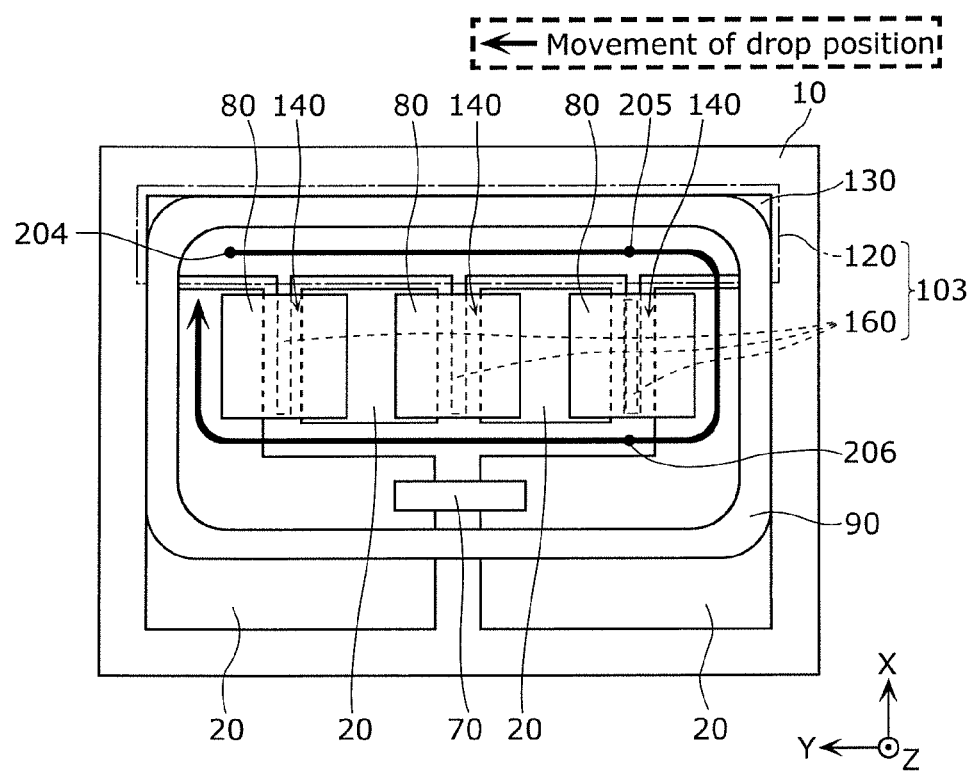
FIG. 16 is a diagram illustrating filling of a resin into a space in a process of producing the semiconductor device according to Embodiment 2.

FIG. 16 is a diagram illustrating the step of filling resin 40 into a space in the process of producing semiconductor device 2 according to Embodiment 2.

Resin 40 is dropped in the same manner as in the step of filling resin 40 into a space in the method of producing semiconductor device 1 according to Embodiment 1, for example, while a resin dropping nozzle (not illustrated) which ejects resin 40 is being horizontally moved. For example, as illustrated with the movement of the drop position of resin 40 indicated by the arrow in FIG. 16, the dropping of resin 40 is started from drop position 204, and the dropping position of resin 40 is moved from drop position 205 to drop position 206.

Thus, in the process of producing semiconductor device 2 according to Embodiment 2, for example, resin 40 is dropped onto extension 120 in the step of filling resin 40 into a space. In the case where extension 120 of interposing member 103 included in semiconductor device 2 has wide portion 130, for example, resin 40 is dropped onto wide portion 130 in the step of filling resin 40 into a space.

Figure 17:
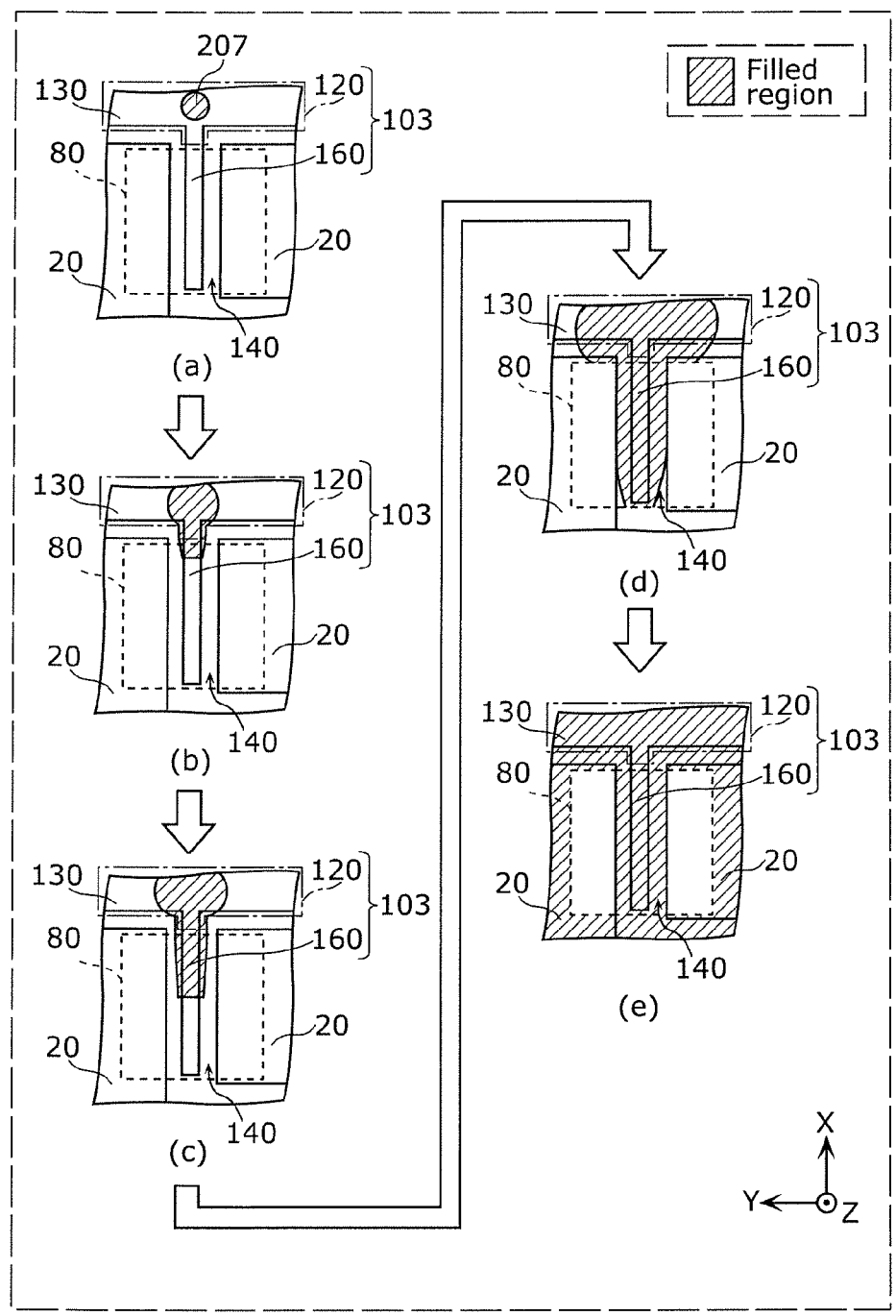
FIG. 17 is a diagram illustrating how the resin wet spreads in the process of producing the semiconductor device according to Embodiment 2.

FIG. 17 is a diagram illustrating how resin 40 wet spreads in the process of producing semiconductor device 2 according to Embodiment 2. FIG. 17 is a partially enlarged top view illustrating interposing member 103 including two adjacent wiring electrodes 20 (that is, the first wiring electrode and the second wiring electrode), and interposer 160 and extension 120 (more specifically, wide portion 130) which are disposed between the two wiring electrodes 20, where semiconductor element 80 is schematically illustrated with the dashed line in the position where semiconductor element 80 is disposed. FIG. 17 also schematically illustrates a filled region with hatching, which is a region of resin 40 located on mounting substrate 10. In FIG. 17, the position from which resin 40 is dropped onto mounting substrate 10 is fixed at drop position 207.

As illustrated in (a) of FIG. 17, assume that resin 40 is first dropped onto drop position 207 on wide portion 130. As illustrated in (b) of FIG. 17, part of resin 40 wet spreads along wide portion 130. Another part of resin 40 wet spreads toward interposer 160 formed continuously with wide portion 130.

In the next step, as illustrated in (c) of FIG. 17, resin 40 brought into contact with interposer 160 wet spreads along interposer 160. Resin 40 also wet spreads to the outside of semiconductor element 80 in a top surface view.

Here, in comparison to the wet spreading of resin 40 in (e) of FIG. 7, resin 40 wet spreading in gap 140 wet spreads to the end of gap 140 in the negative X-axial direction as illustrated in (d) of FIG. 17 while resin 40 wet spreading to the outside of semiconductor element 80 in a top surface view barely wet spreads to the end of gap 140 in the negative X-axial direction. Thus, dropping of resin 40 onto extension 120 enables resin 40 to wet spread faster over interposer 160 disposed in gap 140.

In the next step, as illustrated in (e) of FIG. 17, gap 140 is filled with resin 40 without the air contained.

Step S107 is then executed in the same manner as in the method of producing semiconductor device 1 illustrated in FIG. 5.

Semiconductor device 2 is produced through the steps described above.

[Effects]

As described above, similarly to semiconductor device 1 according to Embodiment 1, semiconductor device 2 according to Embodiment 2 includes mounting substrate 10, the first wiring electrode and the second wiring electrode which are disposed on main surface 150 of mounting substrate 10, interposing member 103 disposed between the first wiring electrode and the second wiring electrode, semiconductor element 80 which is flip-chip connected with the first wiring electrode and the second wiring electrode via first electrical connection member 50 and second electrical connection member 60 and at least partially overlaps interposing member 103 in a top surface view, and resin 40 filled between semiconductor element 80 and mounting substrate 10. The wettability of interposing member 103 to resin 40 is higher than that of mounting substrate 10 to resin 40. Resin 40 is filled in contact with semiconductor element 80 and interposing member 103. Interposing member 103 included in semiconductor device 2 according to Embodiment 2 includes extension 120 located outside semiconductor element 80 in a top surface view.

Such a configuration facilitates the wet spreading of resin 40 dropped onto extension 120 along extension 120 in a direction toward interposer 160 which extends from extension 120 and is located under semiconductor element 80. This increases the filling rate of resin 40 in gap 140. As a result, resin 40 can be filled into gap 140 faster.

Moreover, for example, extension 120 includes wide portion 130 having a width larger than the distance of the space between the first wiring electrode and the second wiring electrode in a top surface view.

Such a configuration precludes the wet spreading of resin 40, which is dropped onto the center of wide portion 130, from wide portion 130 to main surface 150 of mounting substrate 10, and facilitates the wet spreading of resin 40 from wide portion 130 to interposer 160. For this reason, the filling rate of resin 40 to gap 140 can be further increased.

Moreover, similarly to the method of producing semiconductor device 1 according to Embodiment 1, the method of producing semiconductor device 2 according to Embodiment 2 includes forming a first wiring electrode, a second wiring electrode, and interposing member 103 on main surface 150 of mounting substrate 10, interposing member 103 being disposed between the first wiring electrode and the second wiring electrode; flip-chip connecting semiconductor element 80 with the first wiring electrode and the second wiring electrode via first metal connection member 50 and second metal connection member 60 such that semiconductor element 80 at least partially overlaps interposing member 103 in a top surface view; and filling resin 40 into a space between mounting substrate 10 and semiconductor element 80 flip-chip connected with mounting substrate 10, the space extending along interposing member 103. In the method of producing semiconductor device 2 according to Embodiment 2, interposing member 103 includes extension 120 located outside semiconductor element 80 in a top surface view, and resin 40 is dropped onto extension 120 in the step of filling resin 40 into a space.

In such a production method, resin 40 dropped onto extension 120 readily wet spreads along extension 120 in a direction toward interposer 160 which extends from extension 120 and is located under semiconductor element 80. This increases the filling rate of resin 40 in gap 140. As a result, resin 40 can be filled into gap 140 faster.

For example, extension 120 includes wide portion 130 having a width larger than the distance of the space between the first wiring electrode and the second wiring electrode in a top surface view. Resin 40 is dropped onto wide portion 130 in the step of filling resin 40 into a space in the process of producing semiconductor device 2 according to Embodiment 2.

In such a production method, the wet spreading of resin 40, which is dropped onto the center of wide portion 130, from wide portion 130 to main surface 150 of mounting substrate 10 is precluded, and the wet spreading of resin 40 from wide portion 130 to interposer 160 is facilitated. For this reason, the filling rate of resin 40 into gap 140 can be further improved.

MODIFICATIONS

Modifications of the semiconductor device according to Embodiment 2 will now be described. In the modifications described below, differences from the components included in the semiconductor device according to Embodiment 2 will be mainly described, and the descriptions of the same components will be simplified or omitted in some cases. Only the difference between Modifications 1 to 3 described below and semiconductor device 2 according to Embodiment 2 is the shape of the interposing member in a top surface view. For this reason, FIGS. 18 to 20, which are diagrams illustrating Modifications 1 to 3, illustrate partially enlarged interposing members according to Modifications 1 to 3, where some of the components included in semiconductor device 2 according to Embodiment 2 are not illustrated. In FIGS. 18 to 20 and FIG. 23, semiconductor element 80 is schematically illustrated with the dashed line in the position where semiconductor element 80 is located.

Modification 1

Figure 18:
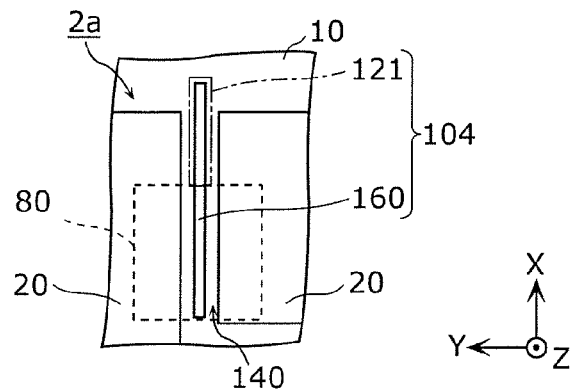
FIG. 18 is a partially enlarged top view illustrating an interposing member included in a semiconductor device according to Modification 1 of Embodiment 2.

FIG. 18 is a partially enlarged top view illustrating interposing member 104 included in semiconductor device 2a according to Modification 1 of Embodiment 2.

Interposing member 104 includes interposer 160 located in a position overlapping semiconductor element 80 in a top surface view, and extension 121 extending from interposer 160 to a position not overlapping semiconductor element 80 in a top surface view. Unlike interposing member 103 illustrated in FIG. 15, for example, interposing member 105 does not include wide portion 130. Such a configuration can also facilitate the wet spreading of resin 40 to gap 140 by dropping resin 40 onto extension 120 during filling of resin 40 into a space.

Modification 2

Figure 19:
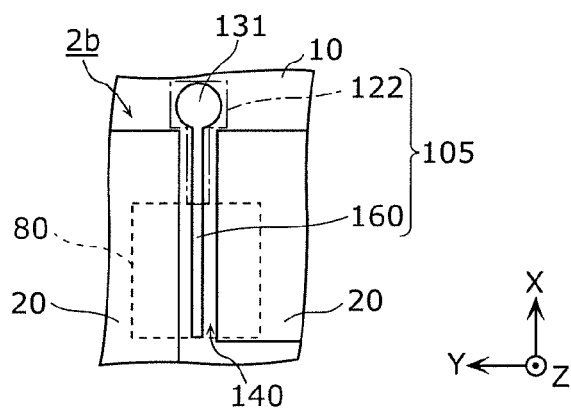
FIG. 19 is a partially enlarged top view illustrating an interposing member included in a semiconductor device according to Modification 2 of Embodiment 2.

FIG. 19 is a partially enlarged top view illustrating interposing member 105 included in semiconductor device 2b according to Modification 2 of Embodiment 2.

Interposing member 105 includes interposer 160 located in a position overlapping semiconductor element 80 in a top surface view, and extension 122 extending from interposer 160 to a position not overlapping semiconductor element 80 in a top surface view. Extension 122 includes wide portion 131 having a width larger than the interval between two adjacent wiring electrodes 20, that is, a first wiring electrode and a second wiring electrode in a top surface view. Wide portion 131 has a circular shape in a top surface view. Resin 40, after dropped onto mounting substrate 10, initially has a circular shape in a top surface view. For this reason, wide portion 131 having a circular shape in a top surface view enables dropping of resin 40 on a larger area of wide portion 130.

Modification 3

Figure 20:
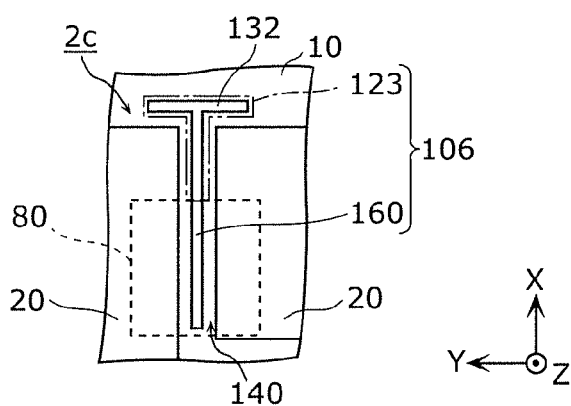
FIG. 20 is a partially enlarged top view illustrating an interposing member included in a semiconductor device according to Modification 3 of Embodiment 2.

FIG. 20 is a partially enlarged top view illustrating interposing member 106 included in semiconductor device 2c according to Modification 3 of Embodiment 2.

Interposing member 106 includes interposer 160 located in a position overlapping semiconductor element 80 in a top surface view, and extension 123 extending from interposer 160 to a position not overlapping semiconductor element 80 in a top surface view. Extension 123 includes wide portion 132 having a width larger than the interval between two adjacent wiring electrodes 20, that is, a first wiring electrode and a second wiring electrode in a top surface view. Wide portion 132 has a band-like shape in a top surface view, and extends, in a top surface view, in a moving direction of a resin dropping nozzle for ejecting resin 40 (not illustrated) which moves near semiconductor element 80 while the nozzle is dropping resin 40. In the present embodiment, the extending direction of wide portion 132 is a direction intersecting perpendicular to the extending direction of interposer 160. Such a configuration facilitates the dropping of resin 40 onto wide portion 132 from the resin dropping nozzle (not illustrated) even when the resin dropping nozzle is moving near semiconductor element 80.

Modification 4

Figure 21:
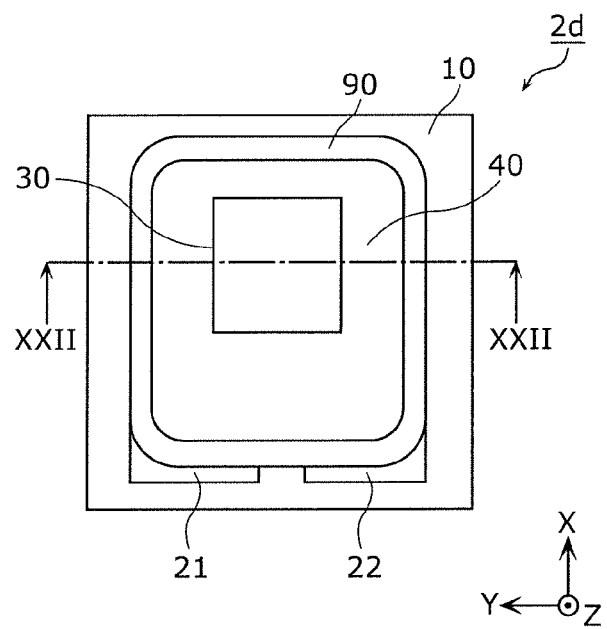
FIG. 21 is a top view illustrating a semiconductor device according to Modification 4 of Embodiment 2.
Figure 22:
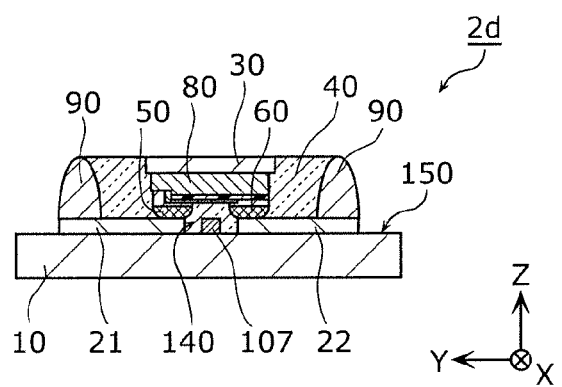
FIG. 22 is a sectional view illustrating the semiconductor device according to Modification 4 of Embodiment 2 taken along line XXII-XXII of FIG. 21.
Figure 23:
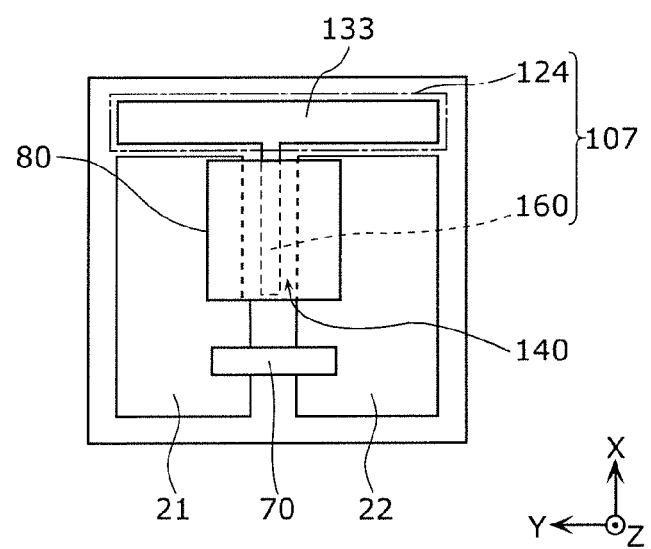
FIG. 23 is a top view illustrating an interposing member included in the semiconductor device according to Modification 4 of Embodiment 2.

FIG. 21 is a top view illustrating semiconductor device 2d according to Modification 4 of Embodiment 2. FIG. 22 is a sectional view illustrating semiconductor device 2d according to Modification 4 of Embodiment 2, taken along line XXII-XXII of FIG. 21. FIG. 23 is a top view illustrating interposing member 107 included in semiconductor device 2d according to Modification 4 of Embodiment 2. In FIG. 23, wavelength converting member 30 and resin 40 included in semiconductor device 2d are omitted.

Unlike semiconductor device 2, semiconductor device 2d includes one semiconductor element 80 and one wavelength converting member 30. In other words, semiconductor device 2d includes the number of semiconductor elements 80 and the number of wavelength converting members 30 which are different from those in semiconductor device 2. Thus, semiconductor device 2d can include the components in any number.

In semiconductor device 2d, two wiring electrodes 21 and 22 are disposed on mounting substrate 10. Similarly to wiring electrode 20, wiring electrode (first wiring electrode)

21 and wiring electrode (second wiring electrode) 22 are patterned wirings disposed on main surface 150 of mounting substrate 10 and electrically connected with semiconductor element 80. More specifically, semiconductor device 2d includes first wiring electrode 21 disposed on main surface 150 of mounting substrate 10, second wiring electrode 22 disposed on main surface 150 of mounting substrate 10, and interposing member 107 at least partially disposed in a space on main surface 150 of mounting substrate 10 and between first wiring electrode 21 and second wiring electrode 22.

Interposing member 107 includes interposer 160 disposed between first wiring electrode 21 and second wiring electrode 22, and extension 124 which extends from interposer 160 and is located in a position outside semiconductor element 80 in a top surface view, that is, in a position not overlapping semiconductor element 80 in a top surface view. Extension 124 includes wide portion 133 having a width larger than the interval between first wiring electrode 21 and second wiring electrode 22 in a top surface view. As illustrated in FIG. 23, interposing member 107 has a T-shape in a top surface view. Thus, the shape of interposing member 107 in a top surface view may be appropriately varied according to the arrangements and shapes of semiconductor element 80, first wiring electrode 21, and second wiring electrode 22.

Other Embodiments

Although the semiconductor devices and the methods for producing the semiconductor devices according to the embodiments and modifications of the present disclosure have been described by way of the embodiments and the modifications, these embodiments and modifications should not be construed as limitation to the present disclosure. A variety of modifications of the embodiments and the modifications conceived by persons skilled in the art without departing from the gist of the present disclosure, or embodiments in combinations of components of different embodiments may also be included in the scope of one or more aspects.

For example, in the case where the wettability of mounting substrate 10 to the resin is compared to that of interposing member 100, the comparison of the wettabilities may be performed using a resin made of another material rather than resin 40 included in semiconductor device 1. For example, in the case where resin 40 included in semiconductor device 1 is a silicone resin, an epoxy resin may be used for the comparison between the wettability of mounting substrate 10 and that of interposing member 100.

In a top surface view, the interval between semiconductor element 80 and mounting substrate 10, the width of interposing member 100, and the interval between adjacent wiring electrodes 20 are not limited to the conditions described above. The intervals and the width may be appropriately varied within the range of the performance required for semiconductor devices 1 and 2 and the range not causing electrical short circuit during mount of semiconductor element 80 on mounting substrate 10. For example, the size and shape of first electrical connection member 50 and second electrical connection member 60 may be arbitrarily determined to control the interval between semiconductor element 80 and mounting substrate 10 to a desired interval.

Moreover, the shape in a top view, the number, and the arrangement of wiring electrode 20 are not limited in particular. For example, in the case where semiconductor devices 1 and 2 including several semiconductor elements 80 are produced and these semiconductor elements 80 are flip-chip connected with mounting substrate 10, wiring electrode 20 may be formed on mounting substrate 10 such that the connection of these semiconductor elements 80 can be arbitrarily selected between connection in series and connection in parallel.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The semiconductor device according to the present disclosure can be used in semiconductor devices including semiconductor elements flip-chip connected with mounting substrates, and can be used in LED light-emitting devices including LEDs as semiconductor elements, for example.

The invention claimed is:
1. A semiconductor device, comprising:
a mounting substrate;
a first wiring electrode, a second wiring electrode, and an interposing member disposed between the first wiring electrode and the second wiring electrode, the first wiring electrode, the second wiring electrode, and the interposing member being disposed on a main surface of the mounting substrate;
a semiconductor element which is flip-chip connected with the first wiring electrode and the second wiring electrode via a first electrical connection member and a second electrical connection member, and at least partially overlaps the interposing member in a top surface view; and
a resin disposed in contact with the semiconductor element and the mounting substrate,
wherein wettability of the interposing member to the resin is higher than wettability of the mounting substrate to the resin, and
the resin is disposed in contact with the semiconductor element and the interposing member.
2. The semiconductor device according to claim 1,
wherein the interposing member is elongated, and includes, on a surface of the interposing member facing the semiconductor element, an uneven portion having at least one projection projecting toward the semiconductor element, and
the at least one projection extends along a longitudinal direction of the interposing member.
3. The semiconductor device according to claim 1, wherein the interposing member is spaced from the first wiring electrode and the second wiring electrode.
4. The semiconductor device according to claim 3, wherein the first wiring electrode, the second wiring electrode, and the interposing member are made of a same material.
5. The semiconductor device according to claim 1, wherein the interposing member includes an extension located outside the semiconductor element in a top surface view.
6. The semiconductor device according to claim 5, wherein the extension includes a wide portion having a width larger than a distance of a space between the first wiring electrode and the second wiring electrode in a top surface view.

7. The semiconductor device according to claim 1,
wherein the main surface of the mounting substrate is formed from one selected from a group consisting of AlN, $Al_2O_3$, BeO, SiC, $SiO_2$, and $Si_3N_4$,
the interposing member has a surface formed from one selected from a group consisting of Au, Al, and Cu, and
the resin contains at least one selected from a group consisting of silicone resins and epoxy resins.

\* \* \* \* \*